US011942166B2

(12) United States Patent
Cho et al.

(10) Patent No.: US 11,942,166 B2
(45) Date of Patent: Mar. 26, 2024

(54) NONVOLATILE MEMORY DEVICE, STORAGE DEVICE INCLUDING NONVOLATILE MEMORY DEVICE, AND OPERATING METHOD OF NONVOLATILE MEMORY DEVICE

(71) Applicant: Samsung Electronics Co., Ltd., Suwon-si (KR)

(72) Inventors: Yongsung Cho, Hwaseong-si (KR); Bong-Kil Jung, Seoul (KR); Hangil Jeong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 18/192,367

(22) Filed: Mar. 29, 2023

(65) Prior Publication Data
US 2023/0253057 A1 Aug. 10, 2023

Related U.S. Application Data

(62) Division of application No. 17/134,968, filed on Dec. 28, 2020, now Pat. No. 11,646,087.

(30) Foreign Application Priority Data

May 4, 2020 (KR) .................. 10-2020-0053180

(51) Int. Cl.
G11C 16/34 (2006.01)
G11C 16/10 (2006.01)
(Continued)

(52) U.S. Cl.
CPC .......... G11C 16/3459 (2013.01); G11C 16/10 (2013.01); G11C 16/24 (2013.01);
(Continued)

(58) Field of Classification Search
CPC ..................................... H10B 12/05
See application file for complete search history.

(56) References Cited

U.S. PATENT DOCUMENTS 7,679,133 B2  3/2010  Son et al.
7,800,955 B2  9/2010  Won et al.
(Continued)

OTHER PUBLICATIONS

Non-Final Office Action dated Aug. 17, 2022 in U.S. Appl. No. 17/134,968.
(Continued)

*Primary Examiner* — Douglas King
(74) *Attorney, Agent, or Firm* — Harness, Dickey & Pierce, P.L.C.

(57) ABSTRACT

An operating method of a nonvolatile memory device includes receiving, at the nonvolatile memory device, a suspend command, suspending, at the nonvolatile memory device, a program operation being performed, in response to the suspend command, receiving, at the nonvolatile memory device, a resume command, and resuming, at the nonvolatile memory device, the suspended program operation in response to the resume command. The program operation includes program loops, each of which includes a bit line setup interval, a program interval, and a verify interval. In the program interval of each of the program loops, a level of a program voltage to be applied to selected memory cells of the nonvolatile memory device increases as much as a first voltage. A difference between a level of the program voltage finally applied s suspend and a level of the program voltage applied first after resume is different from the first voltage.

7 Claims, 16 Drawing Sheets

(51) Int. Cl.
*G11C 16/24* (2006.01)
*G11C 16/26* (2006.01)
*G11C 16/30* (2006.01)
*G11C 16/32* (2006.01)

(52) U.S. Cl.
CPC .............. *G11C 16/26* (2013.01); *G11C 16/30* (2013.01); *G11C 16/32* (2013.01)

(56) References Cited

U.S. PATENT DOCUMENTS

| | | | |
|---|---|---|---|
| 8,493,796 | B2 | 7/2013 | Higashi et al. |
| 8,553,466 | B2 | 10/2013 | Han et al. |
| 8,559,235 | B2 | 10/2013 | Yoon et al. |
| 8,654,587 | B2 | 2/2014 | Yoon et al. |
| 8,694,852 | B2 | 4/2014 | Choi et al. |
| 9,293,206 | B2 | 3/2016 | Nam |
| 9,904,478 | B2 | 2/2018 | Roh |
| 10,268,575 | B2 | 4/2019 | Park et al. |
| 10,304,543 | B2 | 5/2019 | Senoo et al. |
| 10,325,658 | B2 | 6/2019 | Lee |
| 10,896,734 | B2 * | 1/2021 | Yang ................... G11C 16/0483 |
| 11,127,465 | B2 * | 9/2021 | Lee ......................... G11C 16/24 |
| 2011/0233648 | A1 | 9/2011 | Seol et al. |
| 2013/0205085 | A1 * | 8/2013 | Hyun ..................... G06F 3/0611 710/5 |
| 2016/0092130 | A1 | 3/2016 | Choi et al. |
| 2016/0343679 | A1 * | 11/2016 | Chen ......................... H01L 24/05 |
| 2018/0151237 | A1 | 5/2018 | Lee et al. |
| 2018/0197610 | A1 * | 7/2018 | Lee ......................... G11C 16/10 |
| 2019/0171360 | A1 | 6/2019 | Lee et al. |
| 2020/0066744 | A1 * | 2/2020 | Yun ..................... G11C 11/5678 |

OTHER PUBLICATIONS

Notice of Allowance dated Jan. 11, 2023 in U.S. Appl. No. 17/134,968.

* cited by examiner

NONVOLATILE MEMORY DEVICE, STORAGE DEVICE INCLUDING NONVOLATILE MEMORY DEVICE, AND OPERATING METHOD OF NONVOLATILE MEMORY DEVICE

CROSS-REFERENCE TO RELATED APPLICATIONS

This U.S. non-provisional patent application is a Divisional Application of U.S. application Ser. No. 17/134,968, filed on Dec. 28, 2020, which claims priority under 35 U.S.C. § 119 to Korean Patent Application No. 10-2020-0053180 filed on May 4, 2020, in the Korean Intellectual Property Office, the disclosures of which are incorporated by reference herein in their entireties.

BACKGROUND

Example embodiments of the inventive concepts relate to an electronic device, and in particular, relate to a nonvolatile memory device supporting a program operation having improved reliability and flexibility, a storage device including the nonvolatile memory device, and an operating method of the nonvolatile memory device.

A nonvolatile memory includes a read only memory (ROM), a programmable ROM (PROM), an electrically programmable ROM (EPROM), an electrically erasable and programmable ROM (EEPROM), a flash memory, a phase-change random access memory (PRAM), a magnetic RAM (MRAM), a resistive RAM (RRAM), a ferroelectric RAM (FRAM), etc.

In general, a program operation of the nonvolatile memory device requires a longer time than a read operation thereof. While the nonvolatile memory device performs the program operation, an event to urgently access the nonvolatile memory device may occur. For example, an event to urgently write data in the nonvolatile memory device or an event to urgently read data from the nonvolatile memory device may occur.

In the case where the urgent access is delayed until the program operation is completed, the nonvolatile memory device may be considered not to support the urgent access. In the case of suspending the program operation and supporting the urgent access, data associated with the program operation may be lost. Accordingly, the reliability of the nonvolatile memory device may be considered to be low.

SUMMARY

Example embodiments of the inventive concepts provide a nonvolatile memory device having flexibility of supporting an urgent access and having improved reliability, a storage device including the nonvolatile memory device, and an operating method of the nonvolatile memory device.

According to example embodiments, an operating method of a nonvolatile memory device includes receiving, at the nonvolatile memory device, a suspend command, suspending, at the nonvolatile memory device, a program operation being performed, in response to the suspend command, receiving, at the nonvolatile memory device, a resume command, and resuming, at the nonvolatile memory device, the suspended program operation in response to the resume command. The program operation includes program loops, each of which includes a bit line setup interval, a program interval, and a verify interval. In the program interval of each of the program loops, a level of a program voltage to be applied to selected memory cells of the nonvolatile memory device increases as much as a first voltage. A difference between a level of the program voltage finally applied to the selected memory cells before the program operation is suspended and a level of the program voltage applied first to the selected memory cells after the suspended program operation is resumed corresponds to a second voltage different from the first voltage.

According to example embodiments, a nonvolatile memory device includes a memory cell array including memory cells, a row decoder that is connected with the memory cells through word lines, applies a program voltage to a word line selected from the word lines in a program interval of each of program loops of a program operation, and applies verification voltages to the selected word line in a verify interval of each of the program loops, a page buffer that is connected with the memory cells through bit lines and applies voltages to the bit lines in a bit line setup interval of each of the program loops of the program operation, and control logic that controls the row decoder and the page buffer in response to a program command such that the program operation is initiated. In the program interval of each of the program loops, the row decoder increases a level of the program voltage applied to the selected word line as much as a first voltage. The control logic controls the row decoder and the page buffer to suspend the program operation in response to a suspend command and to resume the suspended program operation in response to a resume command. A difference between a level of the program voltage finally applied to the selected word line before the program operation is suspended and a level of the program voltage applied first to the selected word line after the suspended program operation is resumed corresponds to a second voltage different from the first voltage.

According to example embodiments, a storage device includes a nonvolatile memory device including memory cells, and a controller that transmits a write command associated with memory cells selected from the memory cells to the nonvolatile memory device, transmits a suspend command for suspending the write command to the nonvolatile memory device before a program operation is completed, and transmits a resume command for resuming the write command to the nonvolatile memory device. In response to the write command, the nonvolatile memory device applies a program voltage to the selected memory cells repeatedly while increasing the program voltage as much as a first increment. The controller transmits information about a second increment of the program voltage to be applied to the selected memory cells to the nonvolatile memory device together with the resume command. The nonvolatile memory device increases the program voltage as much as the second increment in response to the resume command.

BRIEF DESCRIPTION OF THE FIGURES

The above and other objects and features of the inventive concepts will become apparent by describing in detail example embodiments thereof with reference to the accompanying drawings.

DETAILED DESCRIPTION

Below, example embodiments of the inventive concepts may be described in detail and clearly to such an extent that an ordinary one in the art easily implements the inventive concepts.

Figure 1:
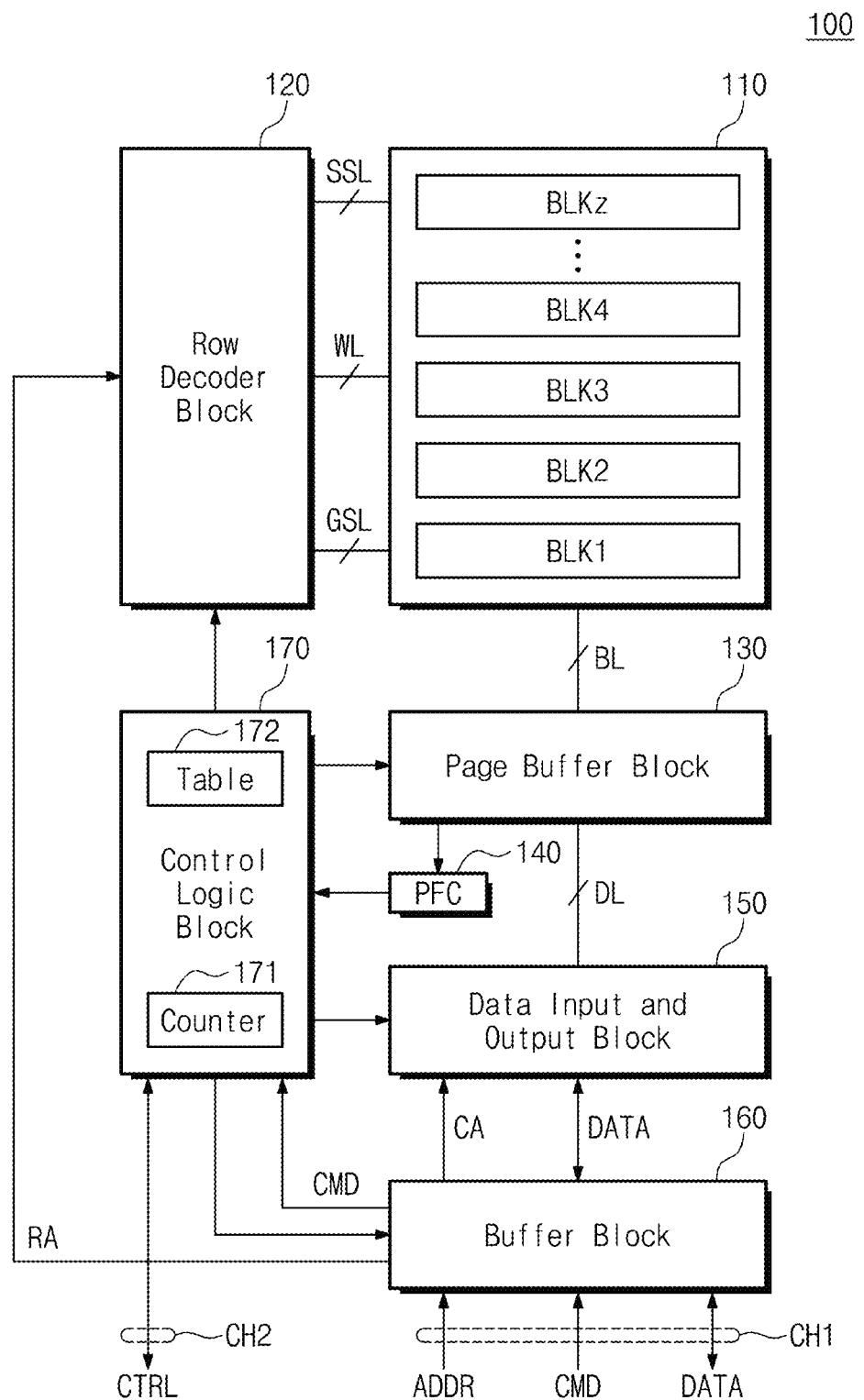
FIG. 1 is a block diagram illustrating a nonvolatile memory device according to example embodiments of the inventive concepts.

FIG. 1 is a block diagram illustrating a nonvolatile memory device 100 according to example embodiments of the inventive concepts. Referring to FIG. 1, the nonvolatile memory device 100 includes a memory cell array 110, a row decoder block 120, a page buffer block 130, a pass/fail check block (PFC) 140, a data input and output block 150, a buffer block 160, and/or a control logic block 170.

The memory cell array 110 includes a plurality of memory blocks BLK1 to BLKz. Each of the memory blocks BLK1 to BLKz includes a plurality of memory cells. Each of the memory blocks BLK1 to BLKz may be connected with the row decoder block 120 through one or more ground selection lines GSL, word lines WL, and one or more string selection lines SSL. Some of the word lines WL may be used as dummy word lines. Each of the memory blocks BLK1 to BLKz may be connected with the page buffer block 130 through a plurality of bit lines BL. The plurality of memory blocks BLK1 to BLKz may be connected in common with the plurality of bit lines BL.

In example embodiments, each of the plurality of memory blocks BLK1 to BLKz may be a unit of an erase operation. The memory cells belonging to each of the memory blocks BLK1 to BLKz may be erased at the same time. For another example, each of the plurality of memory blocks BLK1 to BLKz may be divided into a plurality of sub-blocks. Each of the plurality of sub-blocks may correspond to a unit of an erase operation.

The row decoder block 120 is connected with the memory cell array 110 through the ground selection lines GSL, the word lines WL, and the string selection lines SSL. The row decoder block 120 operates under control of the control logic block 170.

The row decoder block 120 may decode a row address RA received from the buffer block 160 and may control voltages to be applied to the string selection lines SSL, the word lines WL, and the ground selection lines GSL based on the decoded row address.

The page buffer block 130 is connected with the memory cell array 110 through the plurality of bit lines BL. The page buffer block 130 is connected with the data input and output block 150 through a plurality of data lines DL. The page buffer block 130 operates under control of the control logic block 170.

In a program operation, the page buffer block 130 may store data to be written in memory cells. The page buffer block 130 may apply voltages to the plurality of bit lines BL based on the stored data. In a read operation or in a verify read operation that is performed in the program operation or an erase operation, the page buffer block 130 may sense voltages of the bit lines BL and may store the sensing result.

In the verify read operation associated with the program operation or the erase operation, the pass/fail check block 140 may verify the sensing result of the page buffer block 130. For example, in the verify read operation associated with the program operation, the pass/fail check block 140 may count the number of values (e.g., 0s) respectively corresponding to on-cells that are not programmed to a target threshold voltage or more.

In the verify read operation associated with the erase operation, the pass/fail check block 140 may count the number of values (e.g., 1s) respectively corresponding to off-cells that are not erased to a target threshold voltage or less. When the counted result is a threshold value or more, the pass/fail check block 140 may output a fail signal to the control logic block 170. When the counted result is smaller than the threshold value, the pass/fail check block 140 may output a pass signal to the control logic block 170. A program loop of the program operation or an erase loop of the erase operation may be further performed based on a verification result of the pass/fail check block 140.

The data input and output block 150 is connected with the page buffer block 130 through the plurality of data lines DL. The data input and output block 150 may receive a column address CA from the buffer block 160. The data input and output block 150 may output data read by the page buffer block 130 to the buffer block 160 depending on the column address CA. The data input and output block 150 may provide data received from the buffer block 160 to the page buffer block 130, based on the column address CA.

The buffer block 160 may receive a command CMD and an address ADDR from an external device through a first channel CH1 and may exchange data "DATA" with the external device. The buffer block 160 may operate under control of the control logic block 170. The buffer block 160 may provide the command CMD to the control logic block 170. The buffer block 160 may provide the row address RA of the address ADDR to the row decoder block 120 and may provide the column address CA of the address ADDR to the data input and output block 150. The buffer block 160 may exchange the data "DATA" with the data input and output block 150.

The control logic block 170 may exchange control signals CTRL from the external device through a second channel CH2. The control logic block 170 may allow the buffer block 160 to route the command CMD, the address ADDR, and the data "DATA". The control logic block 170 may decode the command CMD received from the buffer block 160 and may control the nonvolatile memory device 100 based on the decoded command.

The control logic block 170 may include a counter 171 and/or a table 172. Under control of the control logic block 170, the counter 171 may count a time that elapses from a specific time point. The table 172 may store parameters according to an elapsing time. The control logic block 170 may support a function (or scheme or operation) of suspending and resuming the program operation by using the counter 171 and the table 172, thus improving the reliability of the program operation in which the suspending and resuming function is supported.

In example embodiments, the nonvolatile memory device 100 may be manufactured in a bonding manner. The memory cell array 110 may be manufactured at a first wafer, and the row decoder block 120, the page buffer block 130, the data input and output block 150, the buffer block 160, and the control logic block 170 may be manufactured at a second wafer. The nonvolatile memory device 100 may be implemented by coupling the first wafer and the second wafer such that an upper surface of the first wafer and an upper surface of the second wafer face each other.

For another example, the nonvolatile memory device 100 may be manufactured in a cell over peri (COP) manner. The peripheral circuit including the row decoder block 120, the page buffer block 130, the data input and output block 150, the buffer block 160, and the control logic block 170 may be implemented on a substrate. The memory cell array 110 may be implemented over the peripheral circuit. The peripheral circuit and the memory cell array 110 may be connected by using through vias.

Figure 2:
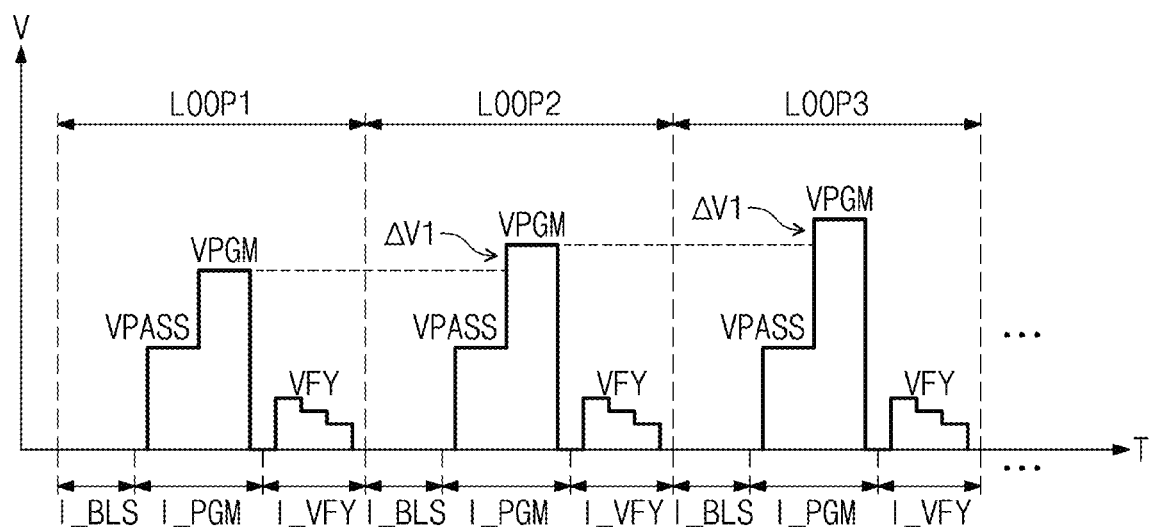
FIG. 2 illustrates an example in which a program operation is performed.

FIG. 2 illustrates an example in which a program operation is performed. In FIG. 2, a horizontal axis represents a time "T", and a vertical axis represents a voltage "V". An example of voltages to be applied to a word line selected from the word lines WL in the program operation is illustrated in FIG. 2.

Referring to FIGS. 1 and 2, the program operation may include a plurality of program loops. In example embodiments, first to third program loops LOOP1 to LOOP3 are illustrated in FIG. 2. However, the number of program loops is not limited to "3".

Each of the program loops LOOP1 to LOOP3 may include a bit line setup interval I_BLS, a program interval I_PGM, and a verify interval I_VFY. In the bit line setup interval I_BLS, voltages of the bit lines BL may be set up. For example, the bit lines BL may be connected with selected memory cells connected with the selected word line (e.g., memory cells targeted for a program operation).

A program voltage (e.g., a power supply voltage) may be applied to bit lines connected with memory cells, the threshold voltages of which are to be increased (or which are to be programmed), from among the selected memory cells. A program-inhibit voltage (e.g., a ground voltage or a voltage similar to the ground voltage) may be applied to bit lines connected with memory cells, the threshold voltages of which are to be maintained (or which are to be program-inhibited), from among the selected memory cells.

In the program interval I_PGM, a pass voltage VPASS may be applied to the word lines WL. The pass voltage VPASS may turn on memory cells connected with the word lines WL. Afterwards, a program voltage VPGM may be applied to the selected word line. The program voltage VPGM may allow threshold voltages of the memory cells to be programmed to increase.

In the verify interval I_VFY, verification voltages VFY may be applied to the selected word line. For example, when two bits are programmed in one memory cell, through the program operation, a threshold voltage of the memory cell may be adjusted to one of three program states or may be maintained as an erase state. That is, the threshold voltage of the memory cell may belong to one of the erase state and the three program states. The verification voltages VFY may include three voltages respectively corresponding to the three program states.

For example, when "n" bits (n being a positive integer) are programmed in one memory cell, through the program operation, a threshold voltage of the memory cell may be adjusted to one of an erase state and ($2^n-1$) program states or may be maintained. The verification voltages VFY may include ($2^n-1$) voltages respectively corresponding to the ($2^n-1$) program states.

The program operation may be performed by repeating program loops. When a program loop progresses (is repeated), a level of the program voltage VPGM may increase as much as a first voltage $\Delta V1$.

While the program operation is performed, an event to urgently access the nonvolatile memory device 100 may occur. The nonvolatile memory device 100 according to example embodiments of the inventive concepts may support a function of suspending and resuming the program operation such that an urgent access is performed while performing the program operation.

An example is illustrated in FIG. 2 as the verify voltages VFY are sequentially applied in descending order from highest to lowest values. However, the order in which the verification voltages VFY are applied may not be associated with levels of the verification voltages VFY. Alternatively, the verification voltages VFY are sequentially applied in ascending order from lowest to highest values.

Figure 3:
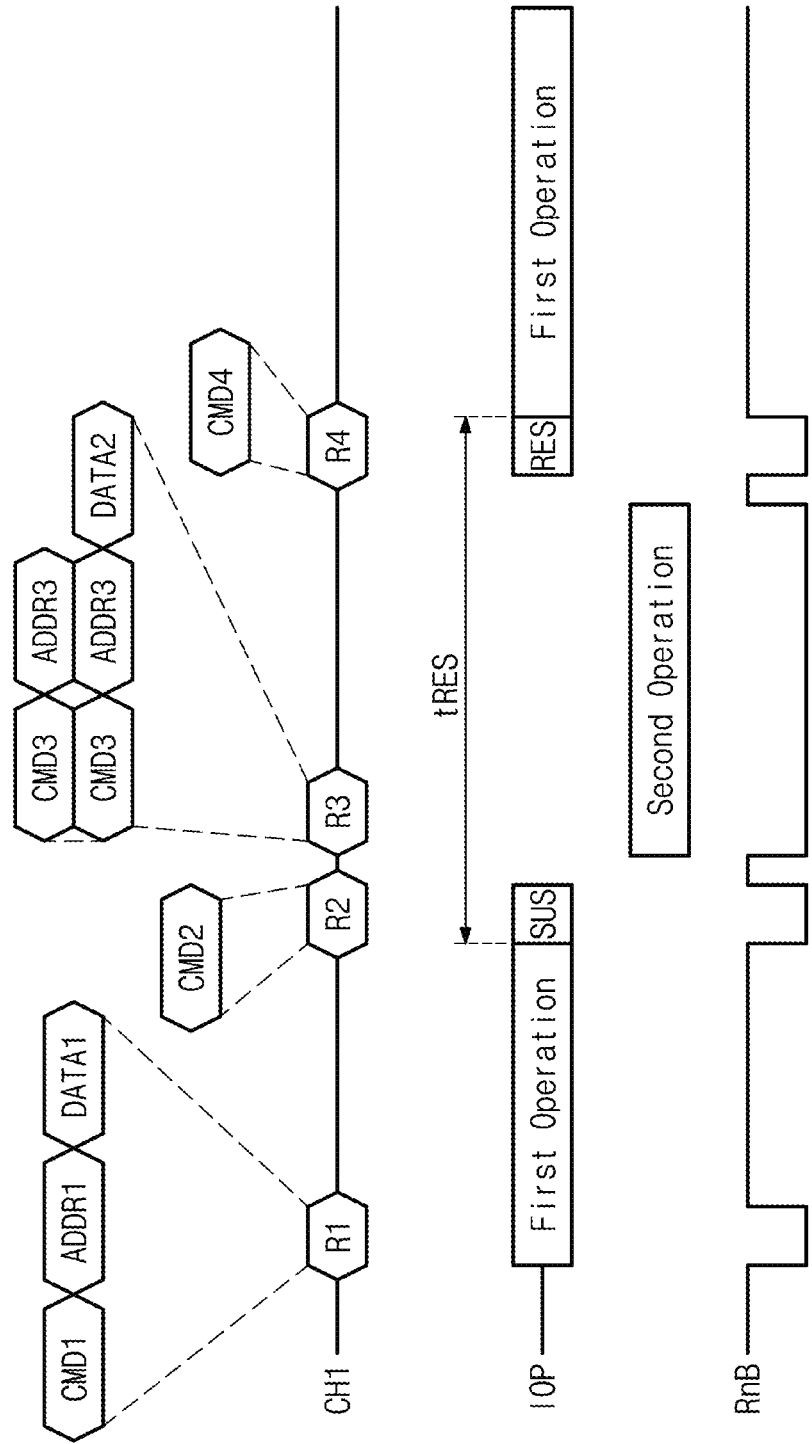
FIG. 3 illustrates an example in which a program operation is suspended and resumed.

FIG. 3 illustrates an example in which a program operation is suspended and resumed. A signal that the nonvolatile memory device 100 receives/transmits through the first channel CH1, an internal operation TOP of the nonvolatile memory device 100, and a ready/busy signal RnB that the nonvolatile memory device 100 outputs through the second channel CH2 as one of the control signal CTRL are illustrated in FIG. 3.

When the internal operation IOP of the nonvolatile memory device 100 is not performed, the nonvolatile memory device 100 may set the ready/busy signal RnB to a high level indicating a ready state. When the ready/busy signal RnB is at the high level, an external device (e.g., a controller) of the nonvolatile memory device 100 may transmit a request to the nonvolatile memory device 100.

For example, the nonvolatile memory device 100 may receive a first request R1 from the external device. The first request R1 may include a first command CMD1, a first address ADDR1, and first data DATA1. The first command CMD1 may be a write command. In response to receiving the first request R1, the nonvolatile memory device 100 may set the ready/busy signal RnB to a busy state, that is, a low level.

In response to the first request R1, the nonvolatile memory device 100 may start a first operation, that is, the program operation. Because the nonvolatile memory device 100 supports the function of suspending and resuming the program operation, the nonvolatile memory device 100 may start the first operation and may set the ready/busy signal RnB to the ready state.

Before the first operation is completed, the nonvolatile memory device 100 may receive a second request R2 from the external device. The second request R2 may include a second command CMD2. The second command CMD2 may be a suspend command. The nonvolatile memory device 100 may perform a suspend operation SUS in response to the second request R2. While the suspend operation SUS is performed based on the second request R2, the nonvolatile memory device 100 may set the ready/busy signal RnB to the busy state.

The suspend operation SUS may include storing (or backing up) progress information of the first operation. The progress information of the first operation may include data (e.g., program progress data) updated (or obtained) by applying a verification result of a program operation of selected memory cells to the first data DATA1 loaded to the page buffer block 130.

The progress information of the first operation may further include the number of program loops already performed, a level of the program voltage VPGM finally applied, and information of states completely programmed from among program states. The progress information of the first operation may further include information of an interval, in which the suspend operation SUS is performed, from among the bit line setup interval I_BLS, the program interval I_PGM, and the verify interval I_VFY of a program loop.

The progress information of the first operation may be stored (or updated) in internal storage of the nonvolatile memory device 100. The suspend operation SUS may further include resetting (or initializing) the page buffer block 130 after storing (or backing up) the progress information.

When the suspend operation SUS is completed, the nonvolatile memory device 100 may set the ready/busy signal RnB to the ready state. After the ready/busy signal RnB is set to the ready state, the nonvolatile memory device 100 may receive a third request R3 from the external device.

The third request R3 may include a third command CMD3, a third address ADDR3, and second data DATA2. In example embodiments, the third command CMD3 may be a write command. Alternatively, the third request R3 may include the third command CMD3 and the third address ADDR3. In example embodiments, the third command CMD3 may be a read command.

The nonvolatile memory device 100 may perform a second operation in response to the third request R3. In example embodiments, while performing the second operation, the nonvolatile memory device 100 may maintain the ready/busy signal RnB at the busy state. For another example, the nonvolatile memory device 100 may support a multi-suspend-resume function. In example embodiments, while performing the second operation, the nonvolatile memory device 100 may set the ready/busy signal RnB to the ready state. While performing the second operation, the nonvolatile memory device 100 may receive an additional suspend command.

When the second operation is completed, the nonvolatile memory device 100 may set the ready/busy signal RnB to the ready state. For another example, in the case where the nonvolatile memory device 100 supports the multi-suspend-resume function, the nonvolatile memory device 100 may notify the external device that the second operation is completed, by allowing the ready/busy signal RnB to sequentially have a ready to busy transition and a busy to ready transition.

Before the second operation is completed, the nonvolatile memory device 100 may receive a fourth request R4 from the external device. The fourth request R4 may include a fourth command CMD4. The fourth command CMD4 may be a resume command. The nonvolatile memory device 100 may perform a resume operation RES in response to the fourth request R4. While the resume operation RES is performed, the nonvolatile memory device 100 may set the ready/busy signal RnB to the busy state.

The resume operation RES may include loading the progress information of the first operation. The resume operation RES may include loading program progress data to the page buffer block 130. Also, the resume operation RES may include setting parameters of a program loop, based on the progress information of the first operation. To set the parameters of the program loop may include setting a level of the program voltage VPGM or setting an interval to be resumed from among intervals of the program loop.

In example embodiments, an interval of a program loop in which the suspend operation SUS is performed may be resumed in the resume operation RES. Alternatively, regardless of the interval of the program loop in which the suspend operation SUS is performed, a first program loop may start in the resume operation RES.

When the resume operation RES is completed, the nonvolatile memory device 100 may resume the first operation. The first operation may be resumed, and the nonvolatile memory device 100 may set the ready/busy signal RnB to the ready state. In example embodiments, when the first operation is completed, the nonvolatile memory device 100 may notify the external device that the first operation is completed, by allowing the ready/busy signal RnB to sequentially have a ready to busy transition and a busy to ready transition.

The external device may determine whether the nonvolatile memory device 100 supports the suspend and resume function. When it is determined that the nonvolatile memory device 100 supports the suspend and resume function, the external device may determine whether the nonvolatile memory device 100 is in a ready state where a command being performed does not exist or in a ready state where the suspend and resume function is supported. When it is determined that the nonvolatile memory device 100 is in the ready state where the suspend and resume function is supported, the external device may sequentially input a suspend command, an access command, and a resume command to the nonvolatile memory device 100.

An example is described as the nonvolatile memory device 100 receives the second command CMD2 as the suspend command. However, the nonvolatile memory device 100 may be configured to perform the suspend operation SUS in response to receiving the read command while the program operation is performed and to perform the read operation.

Also, an example is described as the nonvolatile memory device 100 receives the fourth command CMD4 as the resume command. However, the nonvolatile memory device 100 may be configured to perform the resume operation RES in response to completing the read operation and to resume the program operation.

In FIG. 3, a time from a time point when the suspend operation SUS starts to a time point when the resume operation RES is completed may be a resume time tRES. The selected memory cells may be left alone during the resume time tRES after a portion of the program operation is performed. While the selected memory cells are left alone, threshold voltages of the selected memory cells may change (or may be stabilized).

When the program operation is resumed, as illustrated in FIG. 2, in the case where the program voltage VPGM increases as much as the first voltage Δ1, a distribution of threshold voltages of the selected memory cells may increase due to a change in threshold voltages during the resume time tRES. This may cause an increase in a read error, that is, a decrease in the reliability of the nonvolatile memory device 100.

The nonvolatile memory device 100 according to example embodiments of the inventive concepts may adjust (or set) parameters of a program loop, based on a change in threshold voltages during the resume time tRES. Accordingly, it may be possible to reduce or prevent the reliability of the nonvolatile memory device 100 from decreasing due to the left-alone during the resume time tRES.

Figure 4:
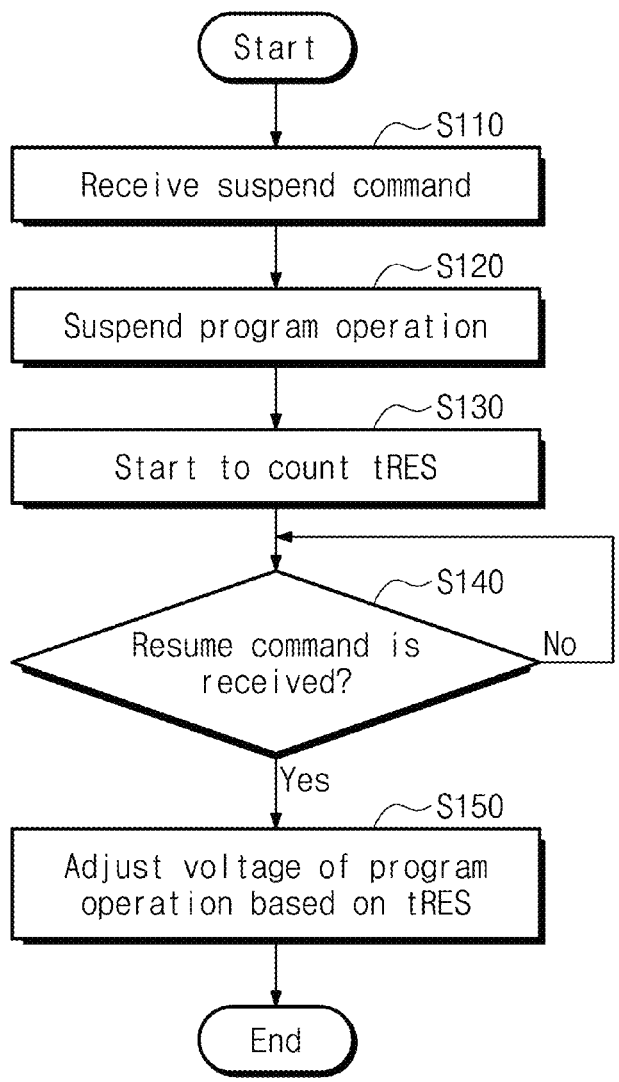
FIG. 4 illustrates a first example of an operating method of a nonvolatile memory device according to example embodiments of the inventive concepts.

FIG. 4 illustrates a first example of an operating method of the nonvolatile memory device 100 according to example embodiments of the inventive concepts. Referring to FIGS. 1 and 4, in operation S110, the nonvolatile memory device 100 may receive the suspend command. For example, while performing the program operation in response to the write command, the nonvolatile memory device 100 may receive the suspend command.

In operation S120, the nonvolatile memory device 100 may suspend the program operation. In operation S130, the nonvolatile memory device 100 may start to count the resume time tRES by using the counter 171. Operation S120 and operation S130 may be performed simultaneously, in parallel, sequentially, or reversely.

In operation S140, the nonvolatile memory device 100 may determine whether the resume command is received. The nonvolatile memory device 100 may wait until the resume command is received. When the resume command is received, the nonvolatile memory device 100 may perform operation S150.

In operation S150, the nonvolatile memory device 100 may adjust a voltage of the program operation based on the resume time tRES. For example, the nonvolatile memory device 100 may adjust the program voltage VPGM based on the resume time tRES. The table 172 may store information of a second voltage ΔV2 corresponding to the resume time tRES. The nonvolatile memory device 100 may adjust the second voltage ΔV2 with reference to the table 172.

Until the resume command is received after the program operation is suspended, the nonvolatile memory device 100 may perform one or more operations in response to a request of the external device. FIG. 4 mainly shows operations of the nonvolatile memory device 100 associated with the suspend and resume function, and thus, the description of the operation(s) that is performed in response to the request of the external device while the program operation is suspended is omitted.

Figure 5:
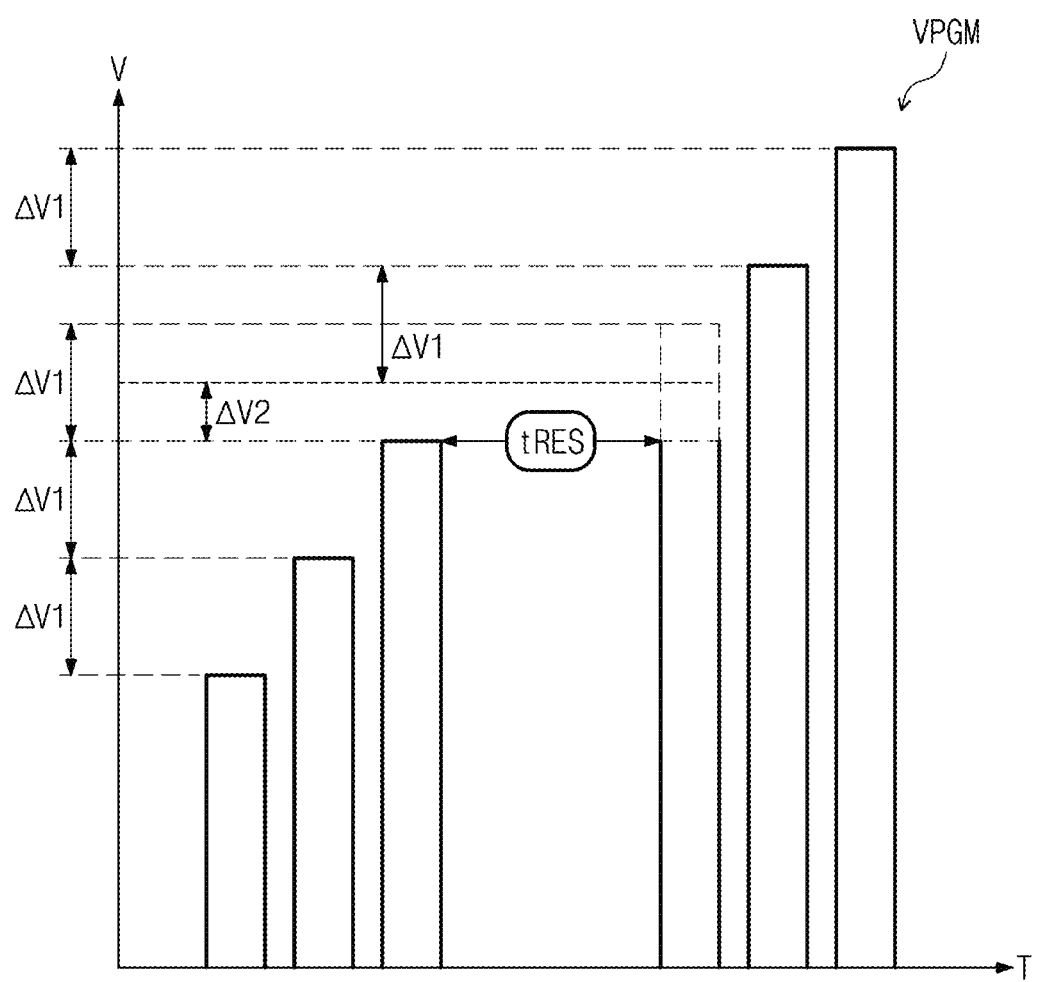
FIG. 5 illustrates a first example in which a program voltage is applied to a selected word line in a program operation.

FIG. 5 illustrates a first example in which the program voltage VPGM is applied to a selected word line in a program operation. Example embodiments in which the program voltage VPGM is applied when the above suspend and resume operation is performed are illustrated in FIG. 5. In FIG. 5, a horizontal axis represents a time "T", and a vertical axis represents a voltage "V".

Referring to FIGS. 1 and 5, when a program loop is performed in the program operation, the program voltage VPGM may increase as much as the first voltage ΔV1. In the case where the suspend operation and the resume operation are performed, during the resume time tRES, the program voltage VPGM may not be applied to a selected word line.

After the resume time tRES elapses, a program loop may be again performed. A difference between the program voltage VPGM firstly applied after the program operation is resumed and the program voltage VPGM finally applied before the program operation is suspended may be the second voltage ΔV2. The second voltage ΔV2 may be equal to or smaller than the first voltage ΔV1. In example embodiments, the second voltage ΔV2 may be adjusted based on the resume time tRES.

As the resume time tRES increases, the second voltage ΔV2 may decrease. As the resume time tRES decreases, the second voltage ΔV2 may increase. As marked by a dotted box in FIG. 5, the second voltage ΔV2 may be determined within a range from "0" to the first voltage ΔV1. A distribution of threshold voltages of memory cells left alone during the resume time tRES may be suppressed from being spread by decreasing the increment of the program voltage VPGM as the resume time tRES increases.

After the program operation is resumed, when the program voltage VPGM is secondly applied, the increment of the program voltage VPGM may be returned to the first voltage ΔV1. That is, when the program loop is performed, the program voltage VPGM may increase from a previous level as much as the first voltage ΔV1.

In example embodiments, the second voltage ΔV2 may be further adjusted based on progress information of the program operation. For example, the second voltage ΔV2 may be further adjusted based on at least one of the number of program loops already performed, a level of the program voltage VPGM finally applied, and information of states completely programmed from among program states.

Also, the second voltage ΔV2 may be further adjusted based on information of an interval, in which the suspend operation SUS is performed, from among the bit line setup interval I_BLS, the program interval I_PGM, and the verify interval I_VFY of a program loop. The second voltage ΔV2 may be further adjusted based on a physical location of selected memory cells.

In example embodiments, the second voltage ΔV2 may be further adjusted based on external information, which is provided from the external device, such as the number of program and erase cycles associated with selected memory cells and a temperature. For example, the external information may be received from the external device together with the suspend command or the resume command.

Figure 6:
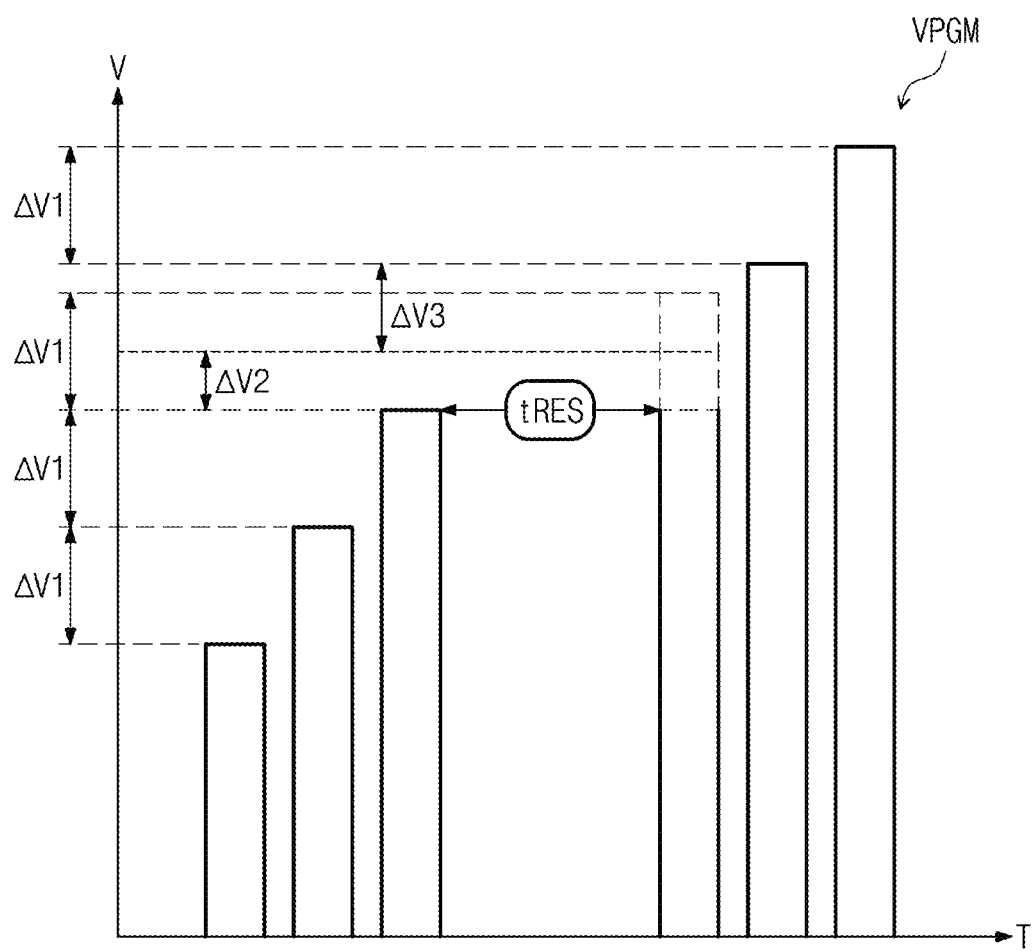
FIG. 6 illustrates a second example in which a program voltage is applied to a selected word line in a program operation.

FIG. 6 illustrates a second example in which the program voltage VPGM is applied to a selected word line in a program operation. Example embodiments in which the program voltage VPGM is applied when the above suspend and resume operation is performed are illustrated in FIG. 6. In FIG. 6, a horizontal axis represents a time "T", and a vertical axis represents a voltage "V".

Compared to FIG. 5, after the program operation is resumed, the increment of the program voltage VPGM may be returned stepwise to the first voltage ΔV1. For example, the increment of the program voltage VPGM firstly applied after the program operation is resumed may be determined as the second voltage ΔV2 based on the resume time tRES.

The increment of the program voltage VPGM secondly applied after the program operation is resumed may be returned to a third voltage ΔV3. The third voltage ΔV3 may be greater than the second voltage ΔV2 and may be smaller than the first voltage ΔV1. The increment of the program voltage VPGM thirdly applied after the program operation is resumed may be the first voltage ΔV1.

An example is illustrated in FIG. 6 as the increment of the program voltage VPGM is returned to the first voltage ΔV1 from the second voltage ΔV2 through two steps. However, the number of steps necessary to return the increment of the program voltage VPGM and a level to which the program voltage VPGM is returned are not limited to the above example.

For example, the increment of the program voltage VPGM may increase as much as a given voltage level. In example embodiments, the increment of the program voltage VPGM may be returned to the first voltage ΔV1 through steps, the number of which corresponds to a value obtained by dividing a value of the first voltage ΔV1 minus the second voltage ΔV2 by a given voltage level.

For another example, the increment of the program voltage VPGM may be returned to the first voltage ΔV1 through a given number of steps. In example embodiments, the program voltage VPGM may increase as much as a voltage level corresponding to a value obtained by dividing a value of the first voltage ΔV1 minus the second voltage ΔV2 by the determined number.

For another example, the increment of the program voltage VPGM and the number of steps may be determined based on at least a part of the resume time tRES, the progress information, and the second voltage ΔV2.

Figure 7:
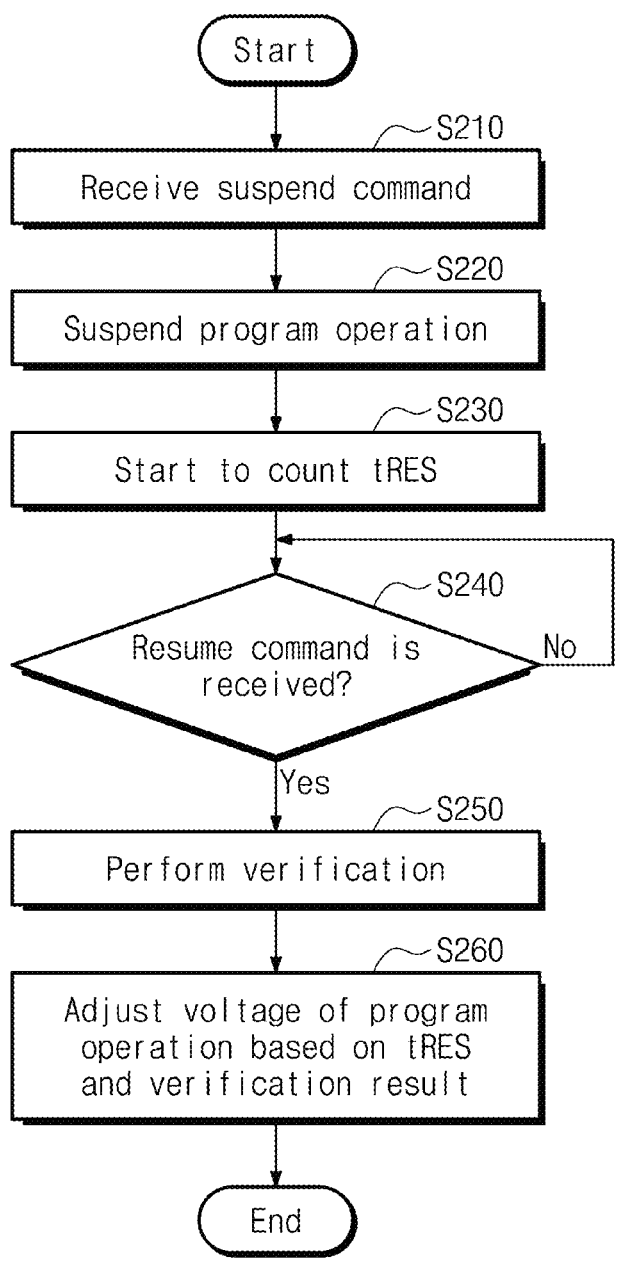
FIG. 7 illustrates a second example of an operating method of a nonvolatile memory device according to example embodiments of the inventive concepts.

FIG. 7 illustrates a second example of an operating method of the nonvolatile memory device 100 according to example embodiments of the inventive concepts. Referring to FIGS. 1 and 7, operation S210 to operation S240 are identical to operation S110 to operation S140 of FIG. 4. Thus, additional description will be omitted to avoid redundancy.

When the program operation is resumed, in operation S250, the nonvolatile memory device 100 may perform verification on selected memory cells. The verification may be performed by using verification voltages finally applied to the selected memory cells before the program operation is suspended.

In operation S260, the nonvolatile memory device 100 may adjust a voltage of the program operation based on the resume time tRES and the verification result. For example, the nonvolatile memory device 100 may compare program progress data and the verification result and may detect the variations in threshold voltages of the selected memory cells. The nonvolatile memory device 100 may adjust the voltage of the program operation based on the detected variations in addition to the resume time tRES.

Figure 8:
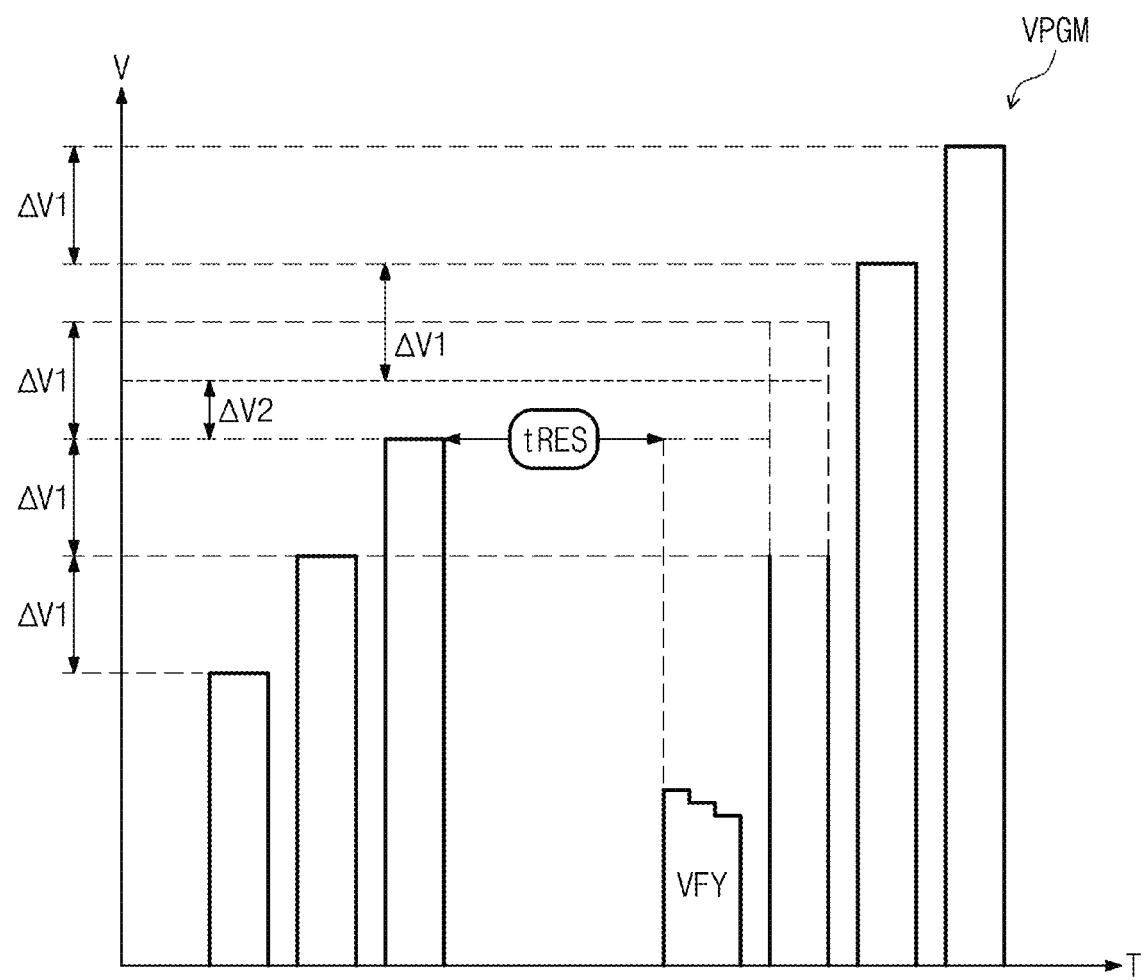
FIG. 8 illustrates a third example in which a program voltage is applied to a selected word line in a program operation.

FIG. 8 illustrates a third example in which the program voltage VPGM is applied to a selected word line in a program operation. Example embodiments in which the program voltage VPGM is applied when the above suspend and resume operation is performed are illustrated in FIG. 8. In FIG. 8, a horizontal axis represents a time "T", and a vertical axis represents a voltage "V".

Compared to the example of FIG. 5, when the program operation is resumed, the verification voltages VFY may be applied to the selected word line. The second voltage ΔV2 may be adjusted based on the resume time tRES and a verification result. In example embodiments, the second voltage ΔV2 may be determined in a range from a negative voltage −ΔV1 to a positive voltage ΔV1.

An example in which the second voltage ΔV2 has negative values may be applied to the examples of FIGS. 5 and 6. As described with reference to FIG. 6, the increment of the program voltage VPGM after the program operation is resumed may be returned from the second voltage ΔV2 to the first voltage ΔV1 through a plurality of steps.

Figure 9:
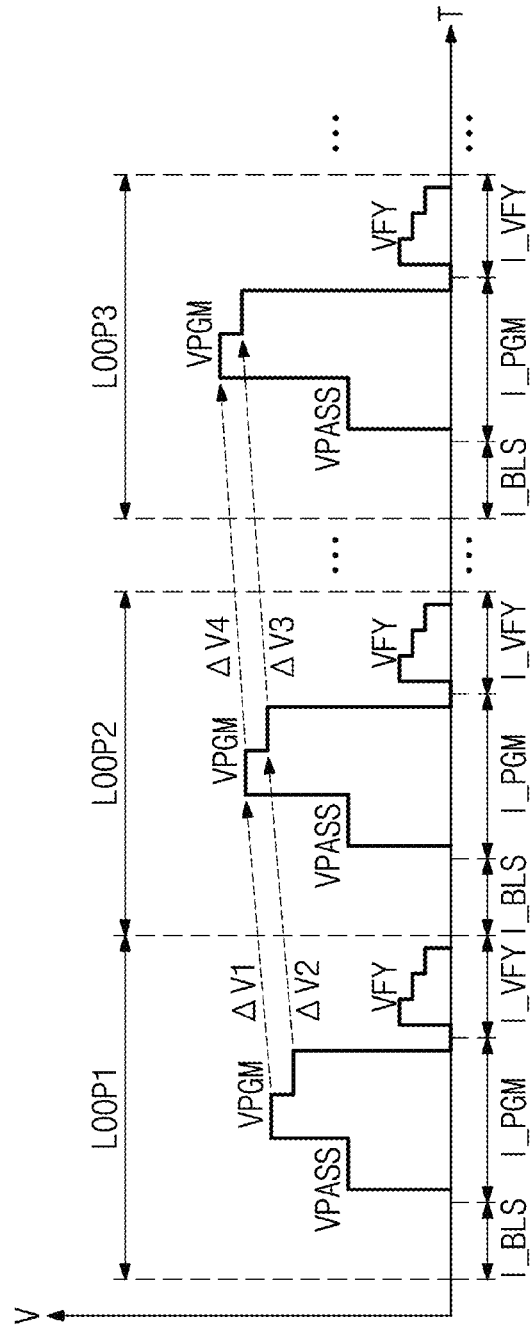
FIG. 9 illustrates another example in which a program operation is suspended and resumed.

FIG. 9 illustrates another example in which suspend and resume operations are performed in the program loops LOOP1 to LOOP3. Referring to FIGS. 1 and 9, in each of the program loops LOOP1 to LOOP3, the program voltage VPGM may have two or more different levels.

The different levels of the program voltage VPGM may be applied to memory cells to be programmed to different program states. For example, a high level of the program voltage VPGM may be applied to memory cells to be programmed to first and second program states. A low level of the program voltage VPGM may be applied to memory cells to be programmed to a third program state.

In example embodiments, the different levels of the program voltage VPGM may be applied in common to memory cells to be programmed to at least one program state. For example, the high level of the program voltage VPGM may be applied to memory cells to be programmed to the first and second program states. The low level of the program voltage VPGM may be applied to memory cells to be programmed to the second and third program states.

When program loops are performed, the low level of the program voltage VPGM may increase as much as a first increment ΔV1. When the program loops are performed, the high level of the program voltage VPGM may increase as much as a second increment ΔV2. In example embodiments, the first increment ΔV1 may be equal to or greater than the second increment ΔV2.

As illustrated in FIG. 9, after the first and second program loops LOOP1 and LOOP2 are performed, the program operation may be suspended. Afterwards, the third program loop LOOP3 may be resumed. In the third program loop LOOP3, a low level of the program voltage VPGM may increase from the level of the second program loop LOOP2 as much as a third increment ΔV3. A high level of the program voltage VPGM may increase from the level of the second program loop LOOP2 as much as a fourth increment ΔV4. The third increment ΔV3 may be equal to or greater than the fourth increment ΔV4.

As described with reference to FIGS. 5, 6, and 8, the third increment ΔV3 may be equal to or smaller than the first increment ΔV1. The third voltage ΔV3 may have a negative value. The increment of the low level of the program voltage VPGM may be returned stepwise. For example, the increment of the low level of the program voltage VPGM may start from the third increment ΔV3, may then increase to at least one of increments between the third increment ΔV3 and the first increment ΔV1, and may then be returned to the first increment ΔV1.

As described with reference to FIGS. 5, 6, and 8, the fourth increment ΔV4 may be equal to or smaller than the second increment ΔV2. The fourth increment ΔV4 may have a negative value. The increment of the high level of the program voltage VPGM may be returned stepwise. For example, the increment of the high level of the program voltage VPGM may start from the fourth increment ΔV4, may then increase to at least one of increments between the fourth increment ΔV4 and the second increment ΔV2, and may then be returned to the second increment ΔV2.

An example is illustrated in FIG. 9 as the program voltage VPGM includes two different levels, but the program voltage VPGM may include three or more different levels.

An example is illustrated in FIG. 9 as the program voltage VPGM is applied in descending order from highest to lowest levels. However, as described with reference to the verification voltages VFY of FIG. 2, an order to apply levels of the program voltage VPGM may be variously changed. Also, the verification voltages VFY may be applied in various orders.

In example embodiments, the description is given as the program voltage VPGM includes different levels. However, the technical idea of the inventive concepts may be understood as program voltages of different levels are applied in the program interval I_PGM.

Figure 10:
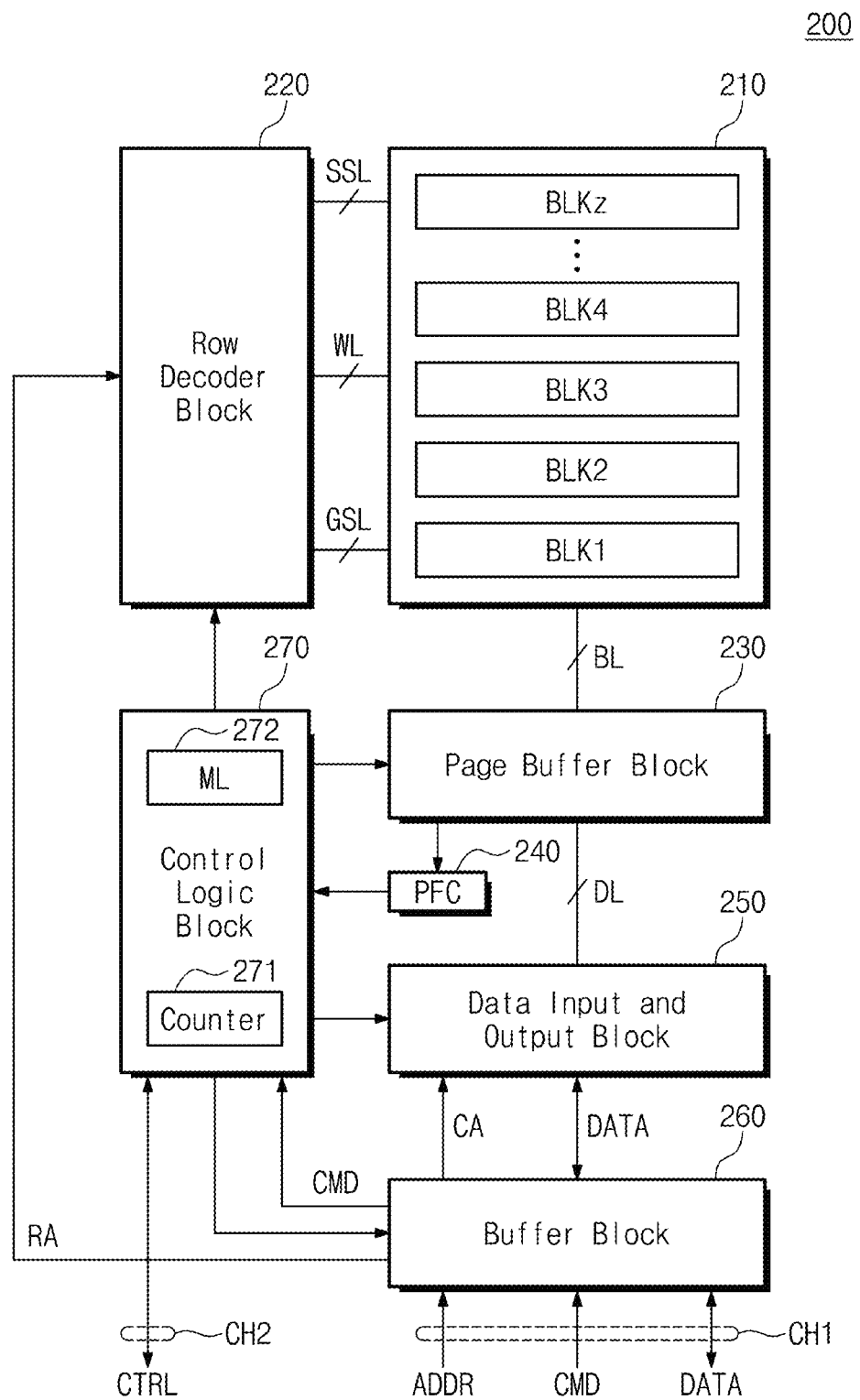
FIG. 10 is a block diagram of a nonvolatile memory device according to example embodiments of the inventive concepts.

FIG. 10 is a block diagram illustrating a nonvolatile memory device 200 according to example embodiments of the inventive concepts. Referring to FIG. 10, the nonvolatile memory device 200 includes a memory cell array 210, a row decoder block 220, a page buffer block 230, a pass/fail check block (PFC) 240, a data input and output block 250, a buffer block 260, and/or a control logic block 270.

Compared to the nonvolatile memory device 100 of FIG. 1, the control logic block 270 of the nonvolatile memory device 200 may include a counter 271 and/or machine learning logic (ML) 272. The counter 271 may be used to count the resume time tRES. The machine learning logic 272 may be used to determine the second voltage ΔV2.

Figure 11:
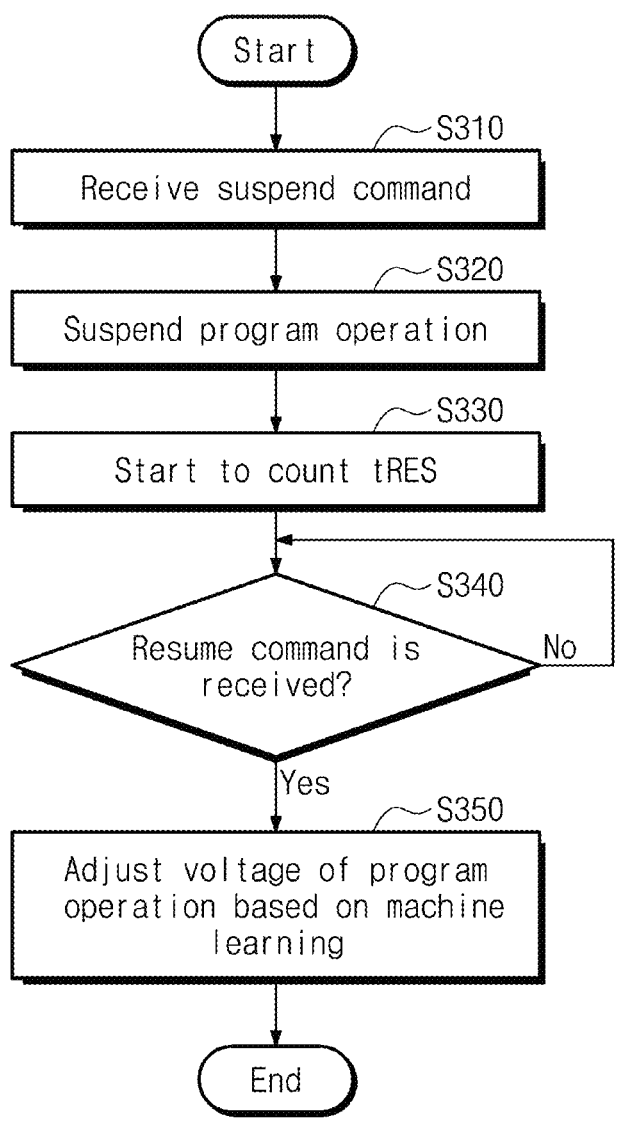
FIG. 11 illustrates an example of an operating method of a nonvolatile memory device of FIG. 10.

FIG. 11 illustrates an example of an operating method of the nonvolatile memory device 200 of FIG. 10. Referring to FIGS. 10 and 11, operation S310 to operation S340 are identical to operation S110 to operation S140 of FIG. 4. Thus, additional description will be omitted to avoid redundancy. In operation S350, the nonvolatile memory device 200 may adjust a voltage of the program operation based on the machine learning.

Figure 12:
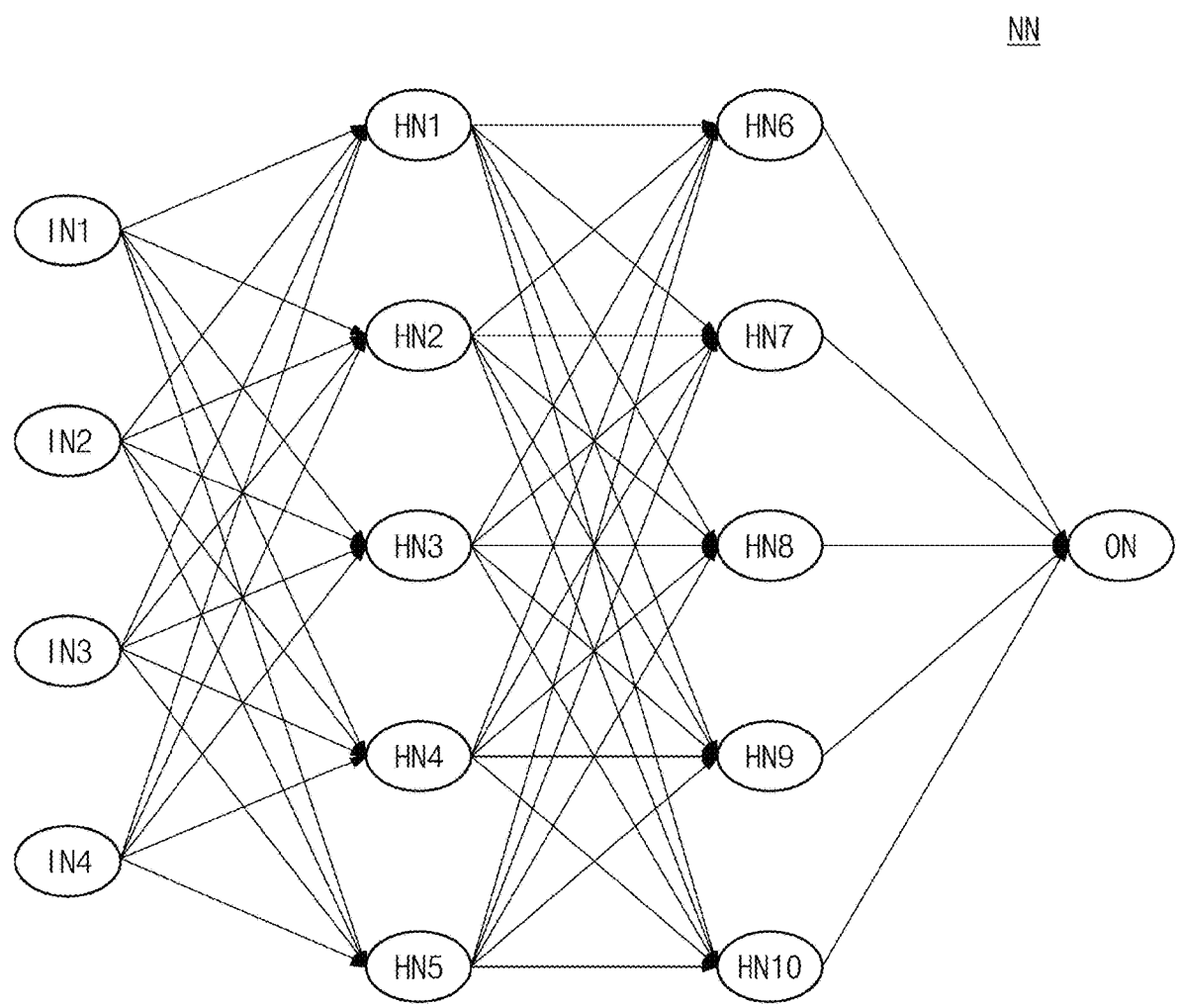
FIG. 12 illustrates a neural network capable of being used as an example of machine learning logic of FIG. 10.

FIG. 12 illustrates a neural network NN capable of being used as an example of machine learning logic of FIG. 10. For example, the neural network NN may include various derivative implementations such as an artificial neural network (ANN), a convolution neural network (CNN), and a recursive neural network (RNN).

Referring to FIG. 12, the neural network NN includes first to fourth input nodes IN1 to IN4, first to tenth hidden nodes HN1 to HN10, and an output node ON. The number of input nodes, the number of hidden nodes, and the number of output nodes may be determined in advance when constructing the neural network.

The first to fourth input nodes IN1 to IN4 form an input layer. The first to fifth hidden nodes HN1 to HN5 form a first hidden layer. The sixth to tenth hidden nodes HN6 to HN10 form a second hidden layer. The output node ON forms an output layer. The number of hidden layers may be determined in advance when constructing the neural network.

Data for learning or inference may be input to the first to fourth input nodes IN1 to IN4. A value of each input node is transferred to the first to fifth hidden nodes HN1 to HN5 of the first hidden layer through branches (or synapses). Each of the branches (or synapses) may be designated to have a corresponding synapse value or a corresponding weight. A value of each input node may be calculated (e.g., multiplied) with the synapse value or weight of the corresponding branch (or synapse) and may be transferred to the first hidden layer.

Values input to the first to fifth hidden nodes HN1 to HN5 are calculated with weights (or synapse values) and may be transferred to the sixth to tenth hidden nodes HN6 to HN10 of the second hidden layer. Inputs of the sixth to tenth hidden nodes HN6 to HN10 are calculated with weights (or synapse values) and are transferred to the output node ON. A value of the output node ON may indicate a result of learning or inference.

The resume time tRES, the number of program loops already performed, a level of the program voltage VPGM finally applied, and information of states completely programmed from among program states may be used as inputs of the neural network NN. Also, information of an interval, in which the suspend operation SUS is performed, from among the bit line setup interval I_BLS, the program interval I_PGM, and the verify interval I_VFY of a program loop may be further used as the inputs of the neural network NN.

The address ADDR, that is, a physical location of selected memory cells, may be used as the inputs of the neural network NN. In example embodiments, external information, which is provided from the external device, such as the number of program and erase cycles associated with selected memory cells and a temperature may be further used as the inputs of the neural network NN. The external information may be received from the external device together with the suspend command or the resume command.

As described with reference to FIGS. 7 and 8, in the case where the nonvolatile memory device 200 is configured to perform verification when the program operation is resumed, a verification result may be further used as the inputs of the neural network NN. For example, a result of comparing the verification result and program progress data may be used as the inputs of the neural network NN. One input node of the neural network NN may receive one input or two or more inputs.

The neural network NN may output a level of the second voltage ΔV2. As described with reference to FIG. 6, when the increment of the program voltage VPGM is stepwise returned, the neural network NN may output the number of steps and an increment of each step.

The machine learning logic may utilize a variety of other artificial neural network organizational and processing models, such as deconvolutional neural networks, recurrent neural networks (RNN) including long short-term memory (LSTM) units and/or gated recurrent units (GRU), stacked neural networks (SNN), state-space dynamic neural networks (SSDNN), deep belief networks (DBN), generative adversarial networks (GANs), and/or restricted Boltzmann machines (RBM).

Alternatively or additionally, such network structures may include other forms of machine learning models, such as, for example, linear and/or logistic regression, statistical clustering, Bayesian classification, decision trees, dimensionality reduction such as principal component analysis, and expert systems; and/or combinations thereof, including ensembles such as random forests. Such machine learning models may also be used to provide various services and/or applications, e.g., an image classify service, a user authentication service based on bio-information or biometric data, an advanced driver assistance system (ADAS) service, a voice assistant service, an automatic speech recognition (ASR) service, or the like, may be performed, executed or processed by electronic devices.

Figure 13:
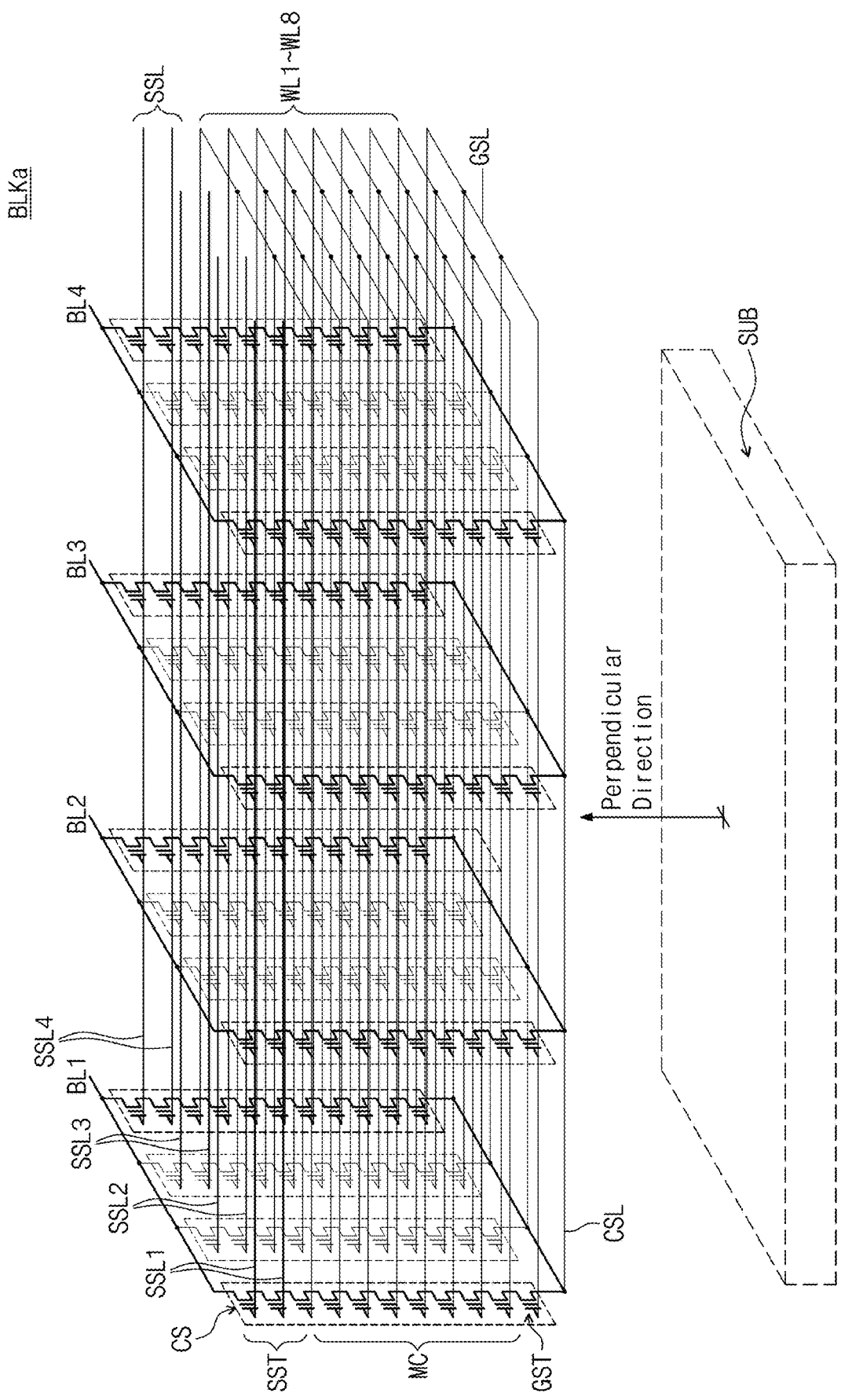
FIG. 13 is a circuit diagram illustrating an example of one memory block of memory blocks of FIG. 1 or 10.

FIG. 13 is a circuit diagram illustrating an example of one memory block BLKa of the memory blocks BLK1 to BLKz of FIG. 1 or 10. Referring to FIG. 13, a plurality of cell strings CS may be arranged on a substrate SUB in rows and columns. The plurality of cell strings CS may be connected in common with a common source line CSL that is formed on (or in) the substrate SUB. In FIG. 13, a location of the substrate SUB is exemplified to help understand a structure of the memory block BLKa.

The cell strings CS of each row may be connected in common with the ground selection line GSL and with a corresponding string selection line of first to fourth string selection lines SSL1 to SSL4. Cell strings of each column may be connected with a corresponding one of first to fourth bit lines BL1 to BL4. To reduce or prevent a drawing from being complicated, the cell strings CS connected with the second and third string selection lines SSL2 and SSL3 are depicted to be blurred.

Each of the cell string CS may include at least one ground selection transistor GST connected to the ground selection line GSL, a plurality of memory cells MC1 to MC8 respectively connected with a plurality of word lines WL1 to WL8, and string selection transistors SST respectively connected with the string selection lines SSL1, SSL2, SSL3, or SSL4.

In each of the cell strings CS, the ground selection transistor GST, the memory cells MC1 to MC8, and the string selection transistors SST may be connected in series along a direction perpendicular to the substrate SUB and may be sequentially stacked along the direction perpendicular to the substrate SUB. In each of the cell strings CS, at least one of the memory cells MC1 to MC8 may be used as a dummy memory cell. The dummy memory cell may not be programmed (e.g., may be program-inhibited) or may be programmed differently from the remaining memory cells other than the dummy memory cell from among the memory cells MC1 to MC8.

In example embodiments, memory cells that are positioned at the same height and are associated with one string selection line SSL1, SSL2, SSL3, or SSL4 may form one physical page. Memory cells of one physical page may be connected to one sub-word line. Sub-word lines of physical pages positioned at the same height may be connected in common to one word line.

When the memory block BLKa is implemented in a three-dimensional structure, characteristics of the memory cells MC may be differently implemented depending on heights of the memory cells MC. For example, sizes of the memory cells MC may change depending on heights of the memory cells MC. Accordingly, the second voltage $\Delta V2$ may be adjusted based on physical locations of the memory cells MC.

Figure 14:
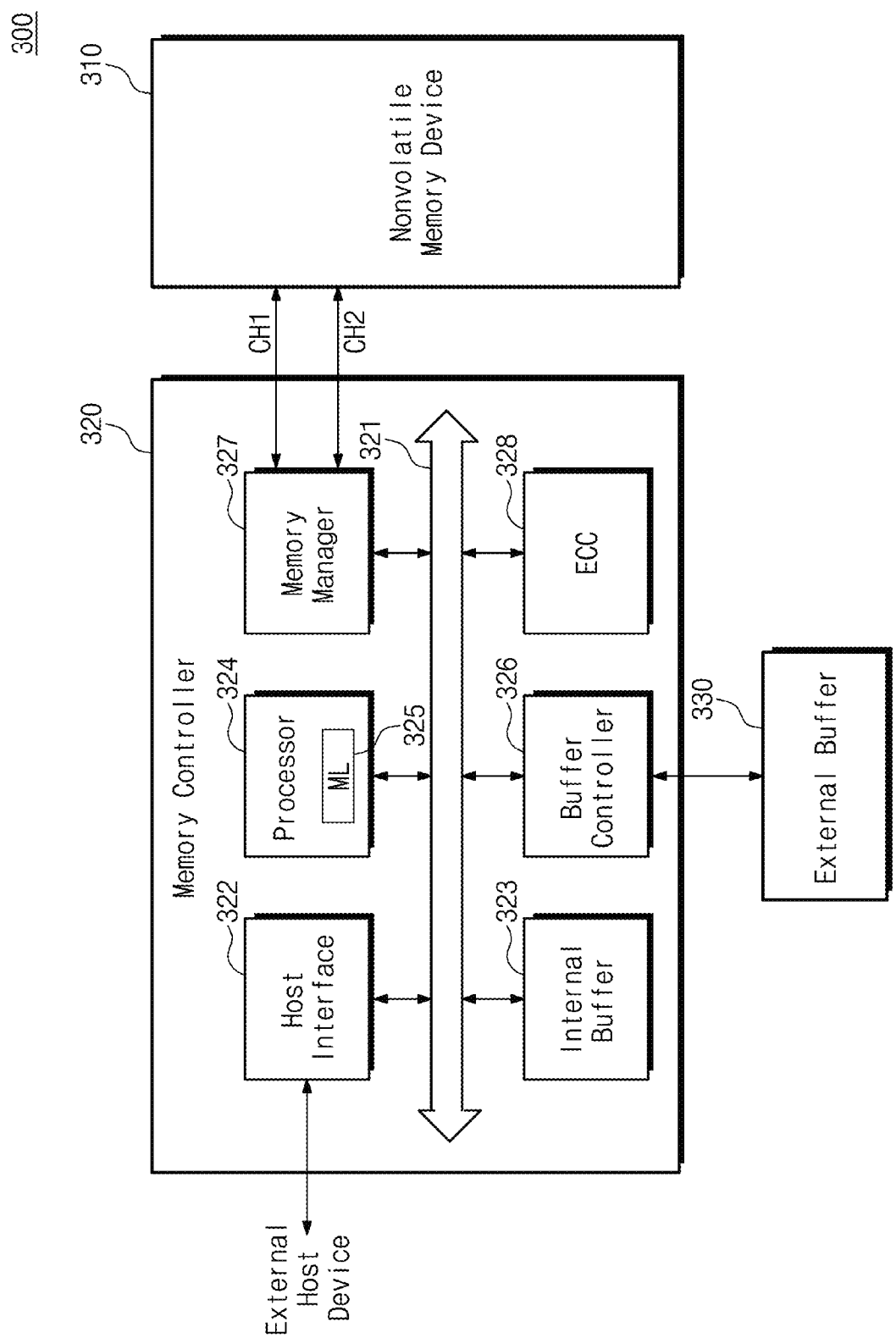
FIG. 14 illustrates a storage device according to example embodiments of the inventive concepts.

FIG. 14 illustrates a storage device 300 according to example embodiments of the inventive concepts. Referring to FIG. 14, the storage device 300 may include a nonvolatile memory device 310, a memory controller 320, and/or a buffer memory 330. The nonvolatile memory device 310 may include a plurality of memory cells. Each of the plurality of memory cells may store two or more bits.

For example, the nonvolatile memory device 310 may include at least one of various nonvolatile memory devices such as a flash memory device, a phase change memory device, a ferroelectric memory device, a magnetic memory device, and a resistive memory device.

The memory controller 320 may receive various requests for writing data in the nonvolatile memory device 310 or reading data from the nonvolatile memory device 310 from an external host device. The memory controller 320 may store (or buffer) user data, that are exchanged with the external host device, in the buffer memory 330 and may store meta data for managing the storage device 300 in the buffer memory 330.

The memory controller 320 may access the nonvolatile memory device 310 through a first channel CH1 and a second channel CH2. For example, the memory controller 320 may transmit a command and an address to the nonvolatile memory device 310 through the first channel CH1. The memory controller 320 may exchange data with the nonvolatile memory device 310 through the first channel CH1.

The memory controller 320 may transmit a first control signal to the nonvolatile memory device 310 through the second channel CH2. The memory controller 320 may receive a second control signal from the nonvolatile memory device 310 through the second channel CH2.

In example embodiments, the memory controller 320 may be configured to control two or more nonvolatile memory devices. The memory controller 320 may provide first different channels and second different channels for each of two or more nonvolatile memory devices.

For another example, the memory controller 320 may share one first channel with respect to two or more nonvolatile memory devices. The memory controller 320 may share a portion of the second channel CH2 with regard to two or more nonvolatile memory devices and may separately provide the remaining portion thereof.

The buffer memory 330 may include a random access memory. For example, the buffer memory 330 may include at least one of a dynamic random access memory, a phase change random access memory, a ferroelectric random access memory, a magnetic random access memory, or a resistive random access memory.

The memory controller 320 may include a bus 321, a host interface 322, an internal buffer 323, a processor 324, a buffer controller 326, a memory manager 327, and/or an error correction code (ECC) block 328.

The bus 321 may provide communication channels between components in the memory controller 320. The host interface 322 may receive various requests from the external host device and may parse the received requests. The host interface 322 may store the parsed requests to the internal buffer 323.

The host interface 322 may transmit various responses to the external host device. The host interface 322 may exchange signals with the external host device in compliance with a given communication protocol. The internal buffer 323 may include a random access memory. For example, the internal buffer 323 may include a static random access memory or a dynamic random access memory.

The processor 324 may drive an operating system or firmware for driving the memory controller 320. The processor 324 may read the parsed requests stored in the internal buffer 323 and may generate commands and addresses for controlling the nonvolatile memory device 310. The processor 324 may transfer the generated commands and addresses to the memory manager 327.

The processor 324 may store various meta information for managing the storage device 300 to the internal buffer 323. The processor 324 may access the buffer memory 330 through the buffer controller 326. The processor 324 may control the buffer controller 326 and the memory manager 327 such that the user data stored in the buffer memory 330 are transmitted to the nonvolatile memory device 310.

The processor 324 may control the host interface 322 and the buffer controller 326 such that the data stored in the buffer memory 330 are transmitted to the external host device. The processor 324 may control the buffer controller 326 and the memory manager 327 such that data received from the nonvolatile memory device 310 are stored to the buffer memory 330. The processor 324 may control the host interface 322 and the buffer controller 326 such that data received from the external host device are stored to the buffer memory 330.

Under control of the processor 324, the buffer controller 326 may write data in the buffer memory 330 or may read data from the buffer memory 330. The memory manager 327 may communicate with the nonvolatile memory device 310 through the first channel CH1 and the second channel CH2 under control of the processor 324.

The error correction code block 328 may perform error correction encoding on data to be transmitted to the nonvolatile memory device 310 by using an error correction code ECC. The error correction code block 328 may perform error correction decoding on data received from the nonvolatile memory device 310 by using the error correction code ECC.

The processor 324 may include machine learning logic 325. The machine learning logic 325 may implement the neural network NN described with reference to FIG. 11. The machine learning logic 325 may infer information of an increment(s) and a step(s) of the program voltage VPGM of a resumed program operation.

In an embodiments, the machine learning logic 325 may be implemented with a separate dedicated processor independent of the processor 324. The separate dedicated processor may include a neural processor or a neuromorphic processor.

In example embodiments, the storage device 300 may not include the buffer memory 330 and the buffer controller 326. When the buffer memory 330 and the buffer controller 326 are not included in the storage device 300, the above functions of the buffer memory 330 and the buffer controller 326 may be performed by the internal buffer 323.

Figure 15:
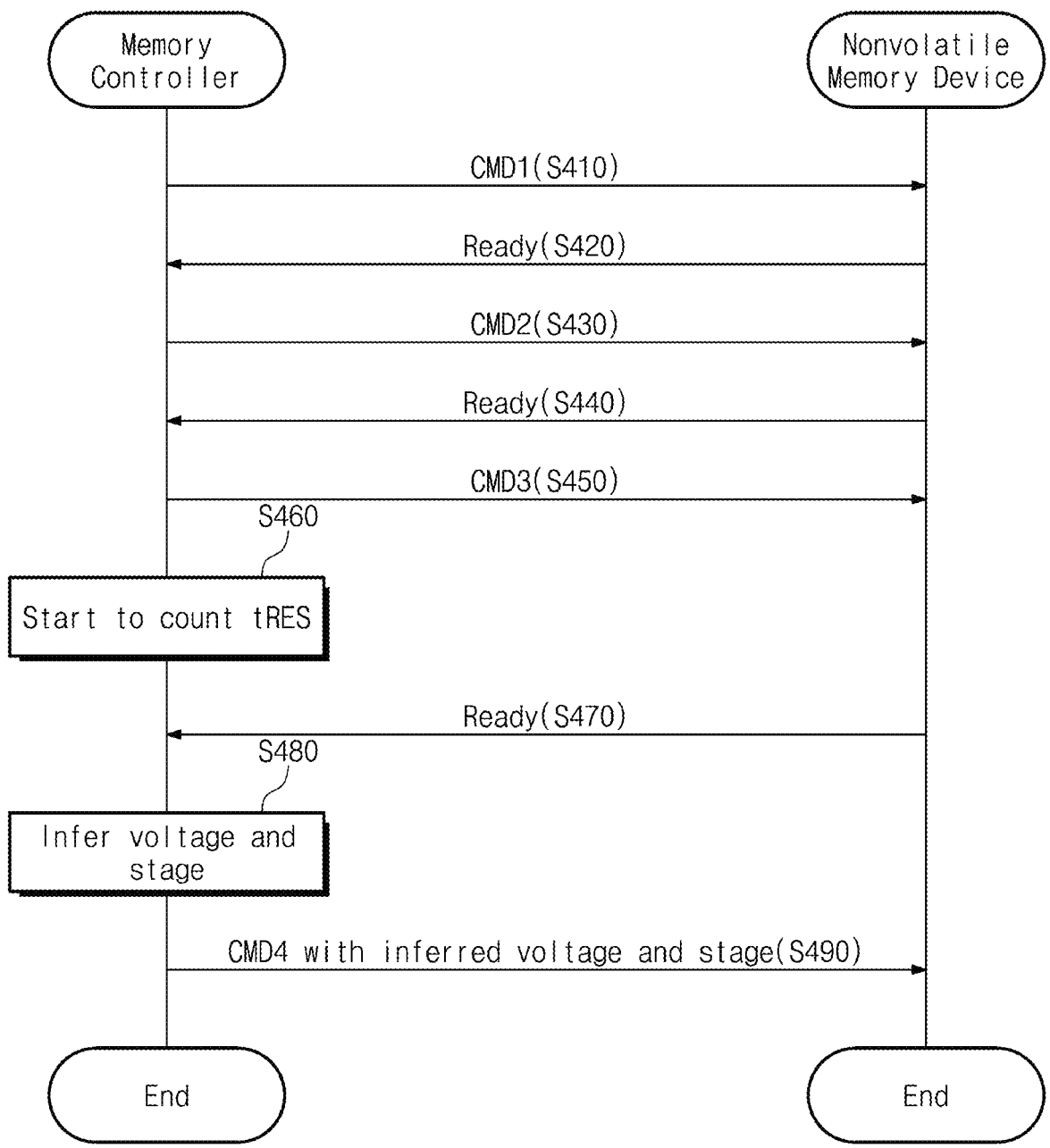
FIG. 15 illustrates an example of an operating method of a storage device of FIG. 14.

FIG. 15 illustrates an example of an operating method of the storage device 300 of FIG. 14. Referring to FIGS. 14 and 15, in operation S410, the memory controller 320 may transmit the first command CMD1 being the write command to the nonvolatile memory device 310. The nonvolatile memory device 310 may start the program operation in response to the first command CMD1 and may inform the memory controller 320 of the ready state in operation S420.

In operation S430, the memory controller 320 may transmit the second command CMD2 being the suspend command to the nonvolatile memory device 310. The nonvolatile memory device 310 may perform the suspend operation and may inform the memory controller 320 of the ready state in operation S440.

In operation S450, the memory controller 320 may transmit the third command CMD3 being the read or write command to the nonvolatile memory device 310. Also, in operation S460, the memory controller 320 may start to count the resume time tRES.

In operation S470, the nonvolatile memory device 310 may complete the read or program operation and may inform the memory controller 320 of the ready state. In operation S480, the memory controller 320 may infer a voltage(s) and a step(s) of the program voltage VPGM of a resumed program operation by using the machine learning logic 325.

In operation S490, the memory controller 320 may transmit information of the inferred voltage(s) and step(s) to the nonvolatile memory device 310 together with the fourth command CMD4 being the resume command. In example embodiments, when progress information of the program operation suspended for inference is required, the memory controller 320 may read the progress information from the nonvolatile memory device 310.

Also, the nonvolatile memory device 310 may transmit the progress information to the memory controller 320 depending on a schedule determined by an algorithm for suspend and resume. For example, the nonvolatile memory device 310 may transmit the progress information to the memory controller 320 in response to the suspend command.

Figure 16:
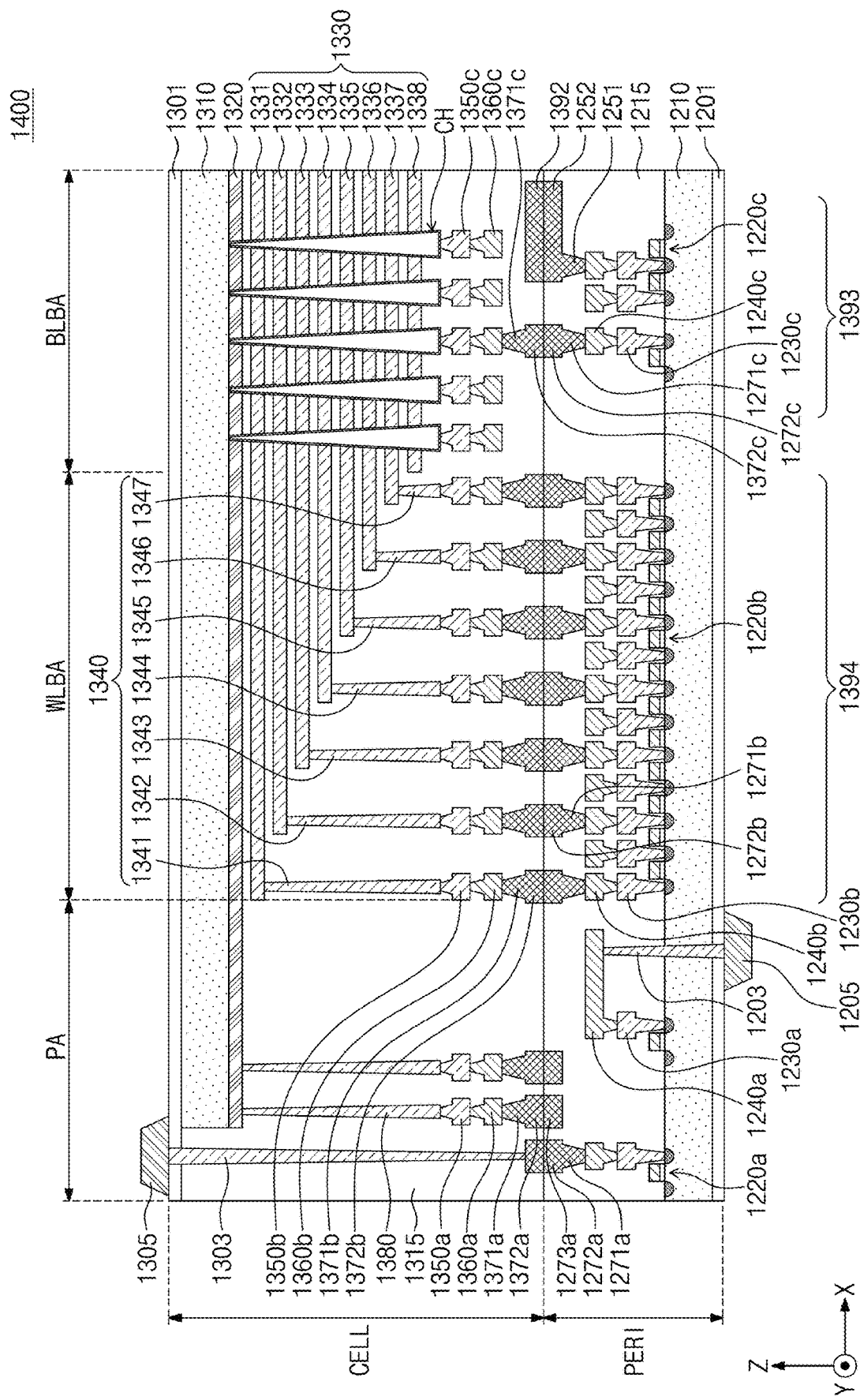
FIG. 16 is a diagram illustrating an example nonvolatile memory device.

FIG. 16 is a diagram illustrating an example nonvolatile memory device. Referring to FIG. 16, a memory device 1400 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip and the lower chip in a bonding manner. For example, the bonding manner may include a method of electrically connecting a bonding metal formed on an uppermost metal layer of the upper chip and a bonding metal formed on an uppermost metal layer of the lower chip. For example, when the bonding metals may be formed of copper (Cu), the bonding manner may be a Cu—Cu bonding, and the bonding metals may also be formed of aluminum or tungsten.

Each of the peripheral circuit region PERI and the cell region CELL of the memory device 1400 may include an external pad bonding area PA, a word line bonding area WLBA, and/or a bit line bonding area BLBA.

The peripheral circuit region PERI may include a first substrate 1210, an interlayer insulating layer 1215, a plurality of circuit elements 1220a, 1220b, and 1220c formed on the first substrate 1210, first metal layers 1230a, 1230b, and 1230c respectively connected to the plurality of circuit elements 1220a, 1220b, and 1220c, and/or second metal layers 1240a, 1240b, and 1240c formed on the first metal layers 1230a, 1230b, and 1230c. In example embodiments, the first metal layers 1230a, 1230b, and 1230c may be formed of tungsten having relatively high resistance, and the second metal layers 1240a, 1240b, and 1240c may be formed of copper having relatively low resistance.

In example embodiments illustrate in FIG. 16, although the first metal layers 1230a, 1230b, and 1230c and the second metal layers 1240a, 1240b, and 1240c are shown and described, they are not limited thereto, and one or more metal layers may be further formed on the second metal layers 1240a, 1240b, and 1240c. At least a portion of the one or more metal layers formed on the second metal layers 1240a, 1240b, and 1240c may be formed of aluminum or the like having a lower resistance than those of copper forming the second metal layers 1240a, 1240b, and 1240c.

The interlayer insulating layer 1215 may be disposed on the first substrate 1210 and cover the plurality of circuit elements 1220a, 1220b, and 1220c, the first metal layers 1230a, 1230b, and 1230c, and the second metal layers 1240a, 1240b, and 1240c. The interlayer insulating layer 1215 may include an insulating material such as silicon oxide, silicon nitride, or the like.

Lower bonding metals 1271b and 1272b may be formed on the second metal layer 1240b in the word line bonding area WLBA. In the word line bonding area WLBA, the lower bonding metals 1271b and 1272b in the peripheral circuit region PERI may be electrically connected to upper bonding metals 1371b and 1372b in the cell region CELL in a bonding manner, and the lower bonding metals 1271b and 1272b and the upper bonding metals 1371b and 1372b may be formed of aluminum, copper, tungsten, or the like.

Further, the upper bonding metals 1371b and 1372b in the cell region CELL may be referred as first metal pads and the lower bonding metals 1271b and 1272b in the peripheral circuit region PERI may be referred as second metal pads.

The cell region CELL may include at least one memory block. The cell region CELL may include a second substrate 1310, an interlayer insulating layer 1315 and a common source line 1320. On the second substrate 1310, a plurality of word lines 1331 to 1338 (e.g., 1330) may be stacked in a direction (a Z-axis direction), perpendicular to an upper surface of the second substrate 1310. At least one string select line and at least one ground select line may be arranged on and below the plurality of word lines 1330, respectively, and the plurality of word lines 1330 may be disposed between the at least one string select line and the at least one ground select line.

Widths of the plurality of word lines 1330 along the X-direction may be different each other. As a distance from the first substrate 1210 of the peripheral circuit region PERI to respective one of the plurality of word line 1330 increases, the width of the respective one of the plurality of word line 1330 decreases. Similarly, as a distance from the second substrate 1310 of the cell region CELL to respective one of the plurality of word line 1330 increases, the width of the respective one of the plurality of word line 1330 increases.

In the bit line bonding area BLBA, a channel structure CH may extend in a direction, perpendicular to the upper surface of the second substrate 1310, and pass through the plurality of word lines 1330, the at least one string select line, and the at least one ground select line. The channel structure CH may include a data storage layer, a channel layer, a buried insulating layer, and the like, and the channel layer may be electrically connected to a first metal layer 1350c and a second metal layer 1360c. For example, the first metal layer 1350c may be a bit line contact, and the second metal layer 1360c may be a bit line. In example embodiments, the bit line 1360c may extend in a first direction (a Y-axis direction), parallel to the upper surface of the second substrate 1310.

The interlayer insulating layer 1315 may be disposed on the second substrate 1310 and cover the common source line 1320, the plurality of word lines 1330, the plurality of cell contact plugs 1340, the first metal layer 1350a, 1350b and 1350c, and the second metal layer 1360a, 1360b and 1360c. The interlayer insulating layer 1315 may include an insulating material such as silicon oxide, silicon nitride, or the like.

In example embodiments illustrated in FIG. 16, an area in which the channel structure CH, the bit line 1360c, and the like are disposed may be defined as the bit line bonding area BLBA. In the bit line bonding area BLBA, the bit line 1360c may be electrically connected to the circuit elements 1220c providing a page buffer 1393 in the peripheral circuit region PERI. For example, the bit line 1360c may be connected to upper bonding metals 1371c and 1372c in the cell region CELL, and the upper bonding metals 1371c and 1372c may be connected to lower bonding metals 1271c and 1272c connected to the circuit elements 1220c of the page buffer 1393.

In the word line bonding area WLBA, the plurality of word lines 1330 may extend in a second direction (an X-axis direction), parallel to the upper surface of the second substrate 1310, and may be connected to a plurality of cell contact plugs 1341 to 1347 (e.g., 1340). The plurality of word lines 1330 and the plurality of cell contact plugs 1340 may be connected to each other in pads provided by at least a portion of the plurality of word lines 1330 extending in different lengths in the second direction. A first metal layer 1350b and a second metal layer 1360b may be connected to an upper portion of the plurality of cell contact plugs 1340 connected to the plurality of word lines 1330, sequentially. The plurality of cell contact plugs 1340 may be connected to the peripheral circuit region PERI by the upper bonding metals 1371b and 1372b of the cell region CELL and the lower bonding metals 1271b and 1272b of the peripheral circuit region PERI in the word line bonding area WLBA.

The plurality of cell contact plugs 1340 may be electrically connected to the circuit elements 1220b providing a row decoder 1394 in the peripheral circuit region PERI. In example embodiments, operating voltages of the circuit elements 1220b providing the row decoder 1394 may be different than operating voltages of the circuit elements 1220c providing the page buffer 1393. For example, operating voltages of the circuit elements 1220c providing the page buffer 1393 may be greater than operating voltages of the circuit elements 1220b providing the row decoder 1394.

A common source line contact plug 1380 may be disposed in the external pad bonding area PA. The common source line contact plug 1380 may be formed of a conductive material such as a metal, a metal compound, polysilicon, or the like, and may be electrically connected to the common source line 1320. A first metal layer 1350a and a second metal layer 1360a may be stacked on an upper portion of the common source line contact plug 1380, sequentially. For example, an area in which the common source line contact plug 1380, the first metal layer 1350a, and the second metal layer 1360a are disposed may be defined as the external pad bonding area PA.

Input-output pads 1205 and 1305 may be disposed in the external pad bonding area PA. Referring to FIG. 16, a lower insulating film 1201 covering a lower surface of the first substrate 1210 may be formed below the first substrate 1210, and a first input-output pad 1205 may be formed on the lower insulating film 1201. The first input-output pad 1205 may be connected to at least one of the plurality of circuit elements 1220a, 1220b, and 1220c disposed in the peripheral circuit region PERI through a first input-output contact plug 1203, and may be separated from the first substrate 1210 by the lower insulating film 1201. In addition, a side insulating film may be disposed between the first input-output contact plug 1203 and the first substrate 1210 to electrically separate the first input-output contact plug 1203 and the first substrate 1210.

Referring to FIG. 16, an upper insulating film 1301 covering the upper surface of the second substrate 1310 may be formed on the second substrate 1310, and a second input-output pad 1305 may be disposed on the upper insulating layer 1301. The second input-output pad 1305 may be connected to at least one of the plurality of circuit elements 1220a, 1220b, and 1220c disposed in the peripheral circuit region PERI through a second input-output contact plug 1303.

According to example embodiments, the second substrate 1310 and the common source line 1320 may not be disposed in an area in which the second input-output contact plug 1303 is disposed. Also, the second input-output pad 1305 may not overlap the word lines 1330 in the third direction (the Z-axis direction). Referring to FIG. 16, the second input-output contact plug 1303 may be separated from the second substrate 1310 in a direction, parallel to the upper surface of the second substrate 1310, and may pass through the interlayer insulating layer 1315 of the cell region CELL to be connected to the second input-output pad 1305 and the lower bonding metals 1271a and 1272a of the peripheral circuit region PERI.

According to example embodiments, the first input-output pad 1205 and the second input-output pad 1305 may be selectively formed. For example, the memory device 1400 may include only the first input-output pad 1205 disposed on the first substrate 1210 or the second input-output pad 1305 disposed on the second substrate 1310. Alternatively, the memory device 1400 may include both the first input-output pad 1205 and the second input-output pad 1305.

A metal pattern in an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 1400 may include a lower metal pattern 1273*a*, corresponding to an upper metal pattern 1372*a* formed in an uppermost metal layer of the cell region CELL, and having the same shape as the upper metal pattern 1372*a* of the cell region CELL, in an uppermost metal layer of the peripheral circuit region PERI. In the peripheral circuit region PERI, the lower metal pattern 1273*a* formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 1271*b* and 1272*b* may be formed on the second metal layer 1240*b* in the word line bonding area WLBA. In the word line bonding area WLBA, the lower bonding metals 1271*b* and 1272*b* of the peripheral circuit region PERI may be electrically connected to the upper bonding metals 1371*b* and 1372*b* of the cell region CELL by a Cu—Cu bonding.

Further, the bit line bonding area BLBA, an upper metal pattern 1392, corresponding to a lower metal pattern 1252 formed in the uppermost metal layer of the peripheral circuit region PERI, and having the same shape as the lower metal pattern 1252 of the peripheral circuit region PERI, may be formed in an uppermost metal layer of the cell region CELL. A contact may not be formed on the upper metal pattern 1392 formed in the uppermost metal layer of the cell region CELL.

In example embodiments, corresponding to a metal pattern formed in an uppermost metal layer in one of the cell region CELL and the peripheral circuit region PERI, a reinforcement metal pattern having the same shape as the metal pattern may be formed in an uppermost metal layer in another one of the cell region CELL and the peripheral circuit region PERI, and a contact may not be formed on the reinforcement metal pattern.

As described above, according to example embodiments of the inventive concepts, a nonvolatile memory device having improved flexibility by supporting a suspend and resume function (or operation) and having improved reliability by adjusting an increment of a program voltage when a program operation is resumed, a storage device including the nonvolatile memory device, and an operating method of the nonvolatile memory device are provided.

In the above example embodiments, components according to the inventive concepts are described by using the terms "first", "second", "third", and the like. However, the terms "first", "second", "third", and the like may be used to distinguish components from each other and do not limit the inventive concepts. For example, the terms "first", "second", "third", and the like do not involve an order or a numerical meaning of any form.

In the above example embodiments, components according to example embodiments of the inventive concepts are described by using blocks. The blocks may be implemented as processing circuitry with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit or circuits enrolled as intellectual property (IP).

According to the inventive concepts, a nonvolatile memory device may suspend a program operation in response to a suspend command and may perform any other operation. The nonvolatile memory device may resume the program operation in response to a resume command. In particular, the reliability of the nonvolatile memory device may be improved by adjusting parameters of the program operation. Accordingly, a nonvolatile memory device having flexibility of supporting an urgent access and having improved reliability, a storage device including the nonvolatile memory device, and an operating method of the nonvolatile memory device are provided.

While the inventive concepts have been described with reference to example embodiments thereof, it will be apparent to those of ordinary skill in the art that various changes and modifications may be made thereto without departing from the spirit and scope of the inventive concepts as set forth in the following claims.

What is claimed is:

1. A nonvolatile memory device comprising:
   a memory cell region including memory cells and first metal pads; and
   a peripheral region comprising:
      second metal pads;
      a row decoder connected with the memory cells through word lines, and configured to apply a program voltage to a word line selected from the word lines in a program interval of each of program loops of a program operation and to apply verification voltages to the selected word line in a verify interval of each of the program loops;
      a page buffer connected with the memory cells through bit lines, and configured to apply voltages to the bit lines in a bit line setup interval of each of the program loops of the program operation; and
      control logic configured to control the row decoder and the page buffer in response to a program command such that the program operation is initiated,
   wherein, in the program interval of each of the program loops, the row decoder increases a level of the program voltage applied to the selected word line as much as a first voltage,
   wherein the control logic controls the row decoder and the page buffer to suspend the program operation in response to receiving a suspend command and to resume the suspended program operation in response to receiving a resume command from an external device,
   wherein, in response to the resume command, the control logic is configured to set the level of the program voltage of the resumed program operation such that a difference between a level of the program voltage finally applied to the selected word line before the program operation is suspended and a level of the program voltage applied first to the selected word line after the suspended program operation is resumed corresponds to a second voltage different from the first voltage and the difference is based on a duration of the suspension,
   wherein the peripheral region is vertically connected to the memory cell region by the first metal pads and the second metal pads.

2. The nonvolatile memory device of claim 1, wherein the control logic is further configured to:
   count a time from when the program operation is suspended to when the suspended program operations is resumed; and
   adjust the second voltage based on the counted time.

3. The nonvolatile memory device of claim 2, wherein the control logic is further configured to:
   control the row decoder and the page buffer to verify selected memory cells connected with the selected word line after the suspended program operation is resumed; and
   adjust the second voltage further based on a result of the verification.

4. The nonvolatile memory device of claim 1, wherein the control logic is further configured to:
   while the program operation is suspended, perform, in response to another command, an operation specified by the another command.

5. The nonvolatile memory device of claim 1, wherein the suspend command includes a read command, and wherein the control logic is further configured to:
   control the row decoder and the page buffer, in response to the read command, to perform a read operation after the program operation is suspended.

6. The nonvolatile memory device of claim 1, wherein, in the program interval of each of the program loops, the row decoder further applies a second program voltage to the selected word line, and
   wherein, in the program interval of each of the program loops, the row decoder increases a level of the second program voltage as much as a third voltage.

7. The nonvolatile memory device of claim 6, wherein a difference between a level of the second program voltage finally applied to the selected word line before the program operation is suspended and a level of the second program voltage applied first to the selected word line after the suspended program operation is resumed corresponds to a fourth voltage different from the third voltage.

* * * * *